United States Patent
Yoshinari et al.

(10) Patent No.: US 11,029,557 B2
(45) Date of Patent: Jun. 8, 2021

(54) OPTICAL LAMINATE FILM AND ORGANIC ELECTROLUMINESCENT DISPLAY DEVICE

(71) Applicant: FUJIFILM Corporation, Tokyo (JP)

(72) Inventors: Shinichi Yoshinari, Kanagawa (JP); Ayako Muramatsu, Kanagawa (JP); Naoya Shibata, Kanagawa (JP); Kunihiro Atsumi, Kanagawa (JP); Daisuke Kashiwagi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/866,522

(22) Filed: May 4, 2020

(65) Prior Publication Data

US 2020/0264475 A1    Aug. 20, 2020

Related U.S. Application Data

(63) Continuation of application No. PCT/JP2018/041561, filed on Nov. 8, 2018.

(30) Foreign Application Priority Data

Nov. 8, 2017 (JP) .............................. JP2017-215825
Sep. 27, 2018 (JP) .............................. JP2018-181941
Sep. 27, 2018 (JP) .............................. JP2018-182758

(51) Int. Cl.
*G02F 1/1335* (2006.01)
*H01L 27/32* (2006.01)
*G02F 1/13363* (2006.01)

(52) U.S. Cl.
CPC .... *G02F 1/133533* (2013.01); *H01L 27/3232* (2013.01); *G02F 1/133541* (2021.01);
(Continued)

(58) Field of Classification Search
CPC ...... G02B 5/30; G02B 5/3083; G02B 5/3025; G02F 1/133528; G02F 1/133536;
(Continued)

(56) References Cited

U.S. PATENT DOCUMENTS 7,012,365 B2    3/2006    Adachi et al.
7,339,316 B2    3/2008    Adachi et al.
(Continued)

FOREIGN PATENT DOCUMENTS

CN    102621617    8/2012
JP    2001316428    11/2001
(Continued)

OTHER PUBLICATIONS

Patent Translation JP 2017-097217 (21 pages).*
(Continued)

*Primary Examiner* — Thoi V Duong
(74) *Attorney, Agent, or Firm* — JCIPRNET

(57) ABSTRACT

An object of the present invention is to provide is an optical laminate film exhibiting excellent reflection tint and an organic EL display device using this optical laminate film and exhibiting excellent reflection tint when turned off. The object is achieved by providing an optical laminate film including a polarizer, a phase difference layer, and a circularly polarized light separating layer in this order, in which an in-plane retardation Re(550) of the phase difference layer is 120 to 160 nm, the polarizer and the phase difference layer are arranged to form an angle of 45°±10°, the circularly polarized light separating layer is a cholesteric liquid crystal layer formed by fixing a cholesteric liquid crystalline phase and having a liquid crystalline molecule as a main component, and Re(550) is 0.5 to 3.0 nm, and an optical laminate film in which a circularly polarized light separating layer has an in-plane phase difference and an angle formed between a
(Continued)

slow axis of a phase difference layer and a slow axis of the circularly polarized light separating layer is −30° to 30°.

18 Claims, 5 Drawing Sheets

(52) U.S. Cl.
CPC .. *G02F 1/133543* (2021.01); *G02F 1/133638* (2021.01); *G02F 2203/20* (2013.01)

(58) Field of Classification Search
CPC ......... G02F 1/133543; G02F 1/133541; G02F 1/133638; G02F 1/13363; G02F 1/1335; G02F 1/133533; G02F 1/133555; G02F 1/13362; G02F 1/13478; G02F 1/133531; G02F 1/133621; G02F 2201/343; G02F 2203/20; H01L 51/5281; H01L 27/3232; G09F 9/00; G09F 9/30; H05B 33/02
See application file for complete search history.

(56) References Cited

U.S. PATENT DOCUMENTS 7,781,962 B2  8/2010  Adachi et al.
2002/0093284 A1  7/2002  Adachi et al.
2018/0164481 A1  6/2018  Atsumi et al.

FOREIGN PATENT DOCUMENTS

| | | |
|---|---|---|
| JP | 4011292 | 11/2007 |
| JP | 2011186158 | 9/2011 |
| JP | 2017097217 | 6/2017 |
| WO | 2017033468 | 3/2017 |

OTHER PUBLICATIONS

"International Search Report (Form PCT/ISA/210) of PCT/JP2018/041561," dated Feb. 12, 2019, with English translation thereof, pp. 1-4.

"Written Opinion of the International Searching Authority (Form PCT/ISA/237) of PCT/JP2018/041561," dated Feb. 12, 2019, with English translation thereof, pp. 1-9.

"Office Action of Japan Counterpart Application" with English translation thereof, dated Dec. 1, 2020, p. 1-p. 8.

\* cited by examiner

OPTICAL LAMINATE FILM AND ORGANIC ELECTROLUMINESCENT DISPLAY DEVICE

CROSS-REFERENCE TO RELATED APPLICATIONS

This application is a Continuation of PCT International Application No. PCT/JP2018/041561 filed on Nov. 8, 2018, which claims priority under 35 U.S.C. § 119(a) to Japanese Patent Application No. 2017-215825 filed on Nov. 8, 2017, Japanese Patent Application No. 2018-181941 filed on Sep. 27, 2018 and Japanese Patent Application No. 2018-182758 filed on Sep. 27, 2018. Each of the above applications is hereby expressly incorporated by reference, in its entirety, into the present application.

BACKGROUND OF THE INVENTION

1. Field of the Invention

The present invention relates to an optical laminate film and an organic electroluminescent display device.

2. Description of the Related Art

In recent years, development of organic electro luminescence (EL, (Organic Light Emitting Diode (OLED)) has been accelerated as a display device to replace a liquid crystal display, and for example, the adoption for flagship models of smartphones has also been progressing.

In addition, since the organic EL substrate has a high surface reflectivity, the organic EL substrate reflects external light particularly in a bright environment, and the contrast is deteriorated. Therefore, in the organic EL display device, an antireflection film including a polarizer and a phase difference layer (λ/4 plate) is arranged.

However, in this configuration, although the deterioration of the contrast due to the reflection of the organic EL substrate can be prevented, the light emitted from the organic EL element is absorbed by the polarizer of the antireflection film, so that the brightness is reduced. Thus, the performance of the organic EL light emitting element or the like cannot be sufficiently exhibited.

In order to solve this problem, it is known that a cholesteric liquid crystal layer formed by fixing a cholesteric liquid crystalline phase is arranged between an antireflection film and an organic EL light emitting element (JP4011292B).

It is known that a cholesteric liquid crystal layer has a function of selectively reflecting a specific circularly polarized light component in a specific wavelength range. Therefore, by arranging the cholesteric liquid crystal layer between the antireflection film and the organic EL substrate, the circularly polarized light component, which would otherwise be absorbed by the polarizer, can be used by reflecting the circularly polarized light component by the cholesteric liquid crystal layer, reflecting the circularly polarized light component by the organic EL substrate again, and converting the circularly polarized light component into a circularly polarized light component that is not absorbed by the polarizer. As a result, it is possible to suppress a decrease in brightness caused by the antireflection film including the polarizer and the λ/4 plate.

SUMMARY OF THE INVENTION

In order to improve the properties of an organic EL display device having such a cholesteric liquid crystal layer, the present inventors have prepared a cholesteric liquid crystal layer that selectively reflects blue light, and have investigated an organic EL display device having the above-described configuration.

As a result, it has been found that there arises a problem that a reflection tint in a case where the organic EL display device is viewed from the front when turned off changes from the intended tint to a red direction, the change is not constant, and the tint is not stable.

It is an unexpected result that the provision of the cholesteric liquid crystal layer causes a change in tint from the intended tint in a case where the turned-off organic EL display device is viewed from the front. On the other hand, it is said that the tint of the display screen is close to black when the organic EL display device is turned off to give a feeling of high quality, and the tint when the organic EL display device is turned off is a highly important evaluation item. In response, the present inventors have further analyzed this phenomenon and have come to the solution described below.

An object of the present invention is to provide an optical laminate film including a polarizer, a phase difference layer, and a circularly polarized light separating layer, and exhibiting excellent reflection tint, and an organic EL display device using this optical laminate film and exhibiting excellent reflection tint when turned off.

In order to solve this problem, the present invention has the following configuration.

[1] An optical laminate film comprising, at least: a polarizer; a phase difference layer; and a circularly polarized light separating layer,
  in which the polarizer, the phase difference layer, and the circularly polarized light separating layer are arranged in this order,
  an in-plane retardation Re(550) of the phase difference layer is 120 to 160 nm,
  the polarizer and the phase difference layer are arranged such that an angle formed between a transmission axis of the polarizer and a slow axis of the phase difference layer is 45°±10°,
  the circularly polarized light separating layer is a cholesteric liquid crystal layer formed by fixing a cholesteric liquid crystalline phase, and an in-plane retardation Re(550) of the cholesteric liquid crystal layer is 0.5 to 3.0 nm.

[2] An optical laminate film comprising, at least: a polarizer; a phase difference layer; and a circularly polarized light separating layer,
  in which the polarizer, the phase difference layer, and the circularly polarized light separating layer are arranged in this order,
  an in-plane retardation Re(550) of the phase difference layer is 120 to 160 nm,
  the polarizer and the phase difference layer are arranged such that an angle formed between a transmission axis of the polarizer and a slow axis of the phase difference layer is 45°±10°,
  the circularly polarized light separating layer is a cholesteric liquid crystal layer formed by fixing a cholesteric liquid crystalline phase and having a liquid crystalline molecule as a main component, the circularly polarized light separating layer has an in-plane phase difference, and an angle formed between a slow axis of the phase difference layer and a slow axis of the circularly polarized light separating layer is −30° to 30°.

[3] The optical laminate film according to [1] or [2], in which the circularly polarized light separating layer is formed of a disk-like liquid crystal compound.

[4] The optical laminate film according to any one of [1] to [3], in which a selective reflection center wavelength of the circularly polarized light separating layer is within a range of 430 to 480 nm.

[5] The optical laminate film according to any one of [1] to [3], in which a selective reflection center wavelength of the circularly polarized light separating layer is within a range of 700 to 800 nm.

[6] The optical laminate film according to any one of [1] to [5], in which the phase difference layer exhibits reciprocal wavelength dispersibility.

[7] The optical laminate film according to any one of [1] to [6], in which the number of spiral turns of the circularly polarized light separating layer is 1.5 to 6.5.

[8] An organic electroluminescent display device comprising: the optical laminate film according to any one of [1] to [7]; and an organic electroluminescent light emitting element, in which the optical laminate film and the organic electroluminescent light emitting element are arranged so as to sandwich the circularly polarized light separating layer between the phase difference layer and the organic electroluminescent light emitting element.

[9] The organic electroluminescent display device according to [8], in which a total of retardations Rth(550) in a thickness direction of members arranged between the polarizer and the organic electroluminescent light emitting element is −50 to 50 nm.

[10] The organic electroluminescent display device according to [8] or [9], further comprising: a C-plate between the polarizer and the organic electroluminescent light emitting element.

According to the present invention, it is possible to provide an optical laminate film exhibiting excellent reflection tint, and an organic EL display device exhibiting excellent reflection tint when turned off.

DESCRIPTION OF THE PREFERRED EMBODIMENTS

Figure 1:
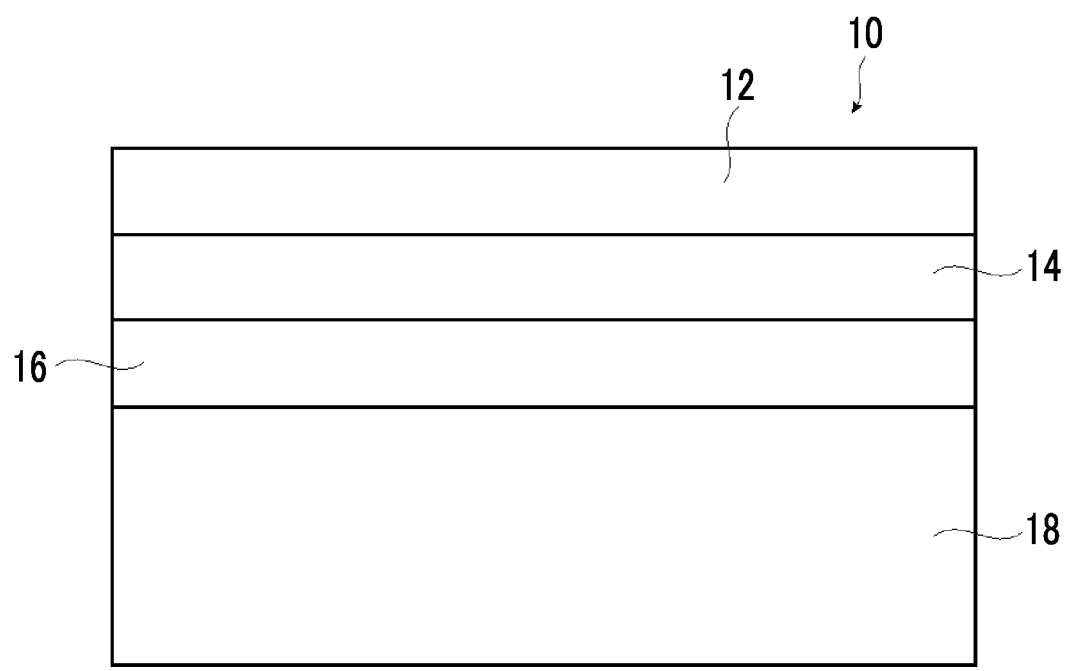
FIG. 1 is a conceptual view showing an example of an organic EL display device according to the present invention.

Hereinafter, an optical laminate film and an organic electroluminescent display device (organic EL display device) according to embodiments of the present invention will be described in detail.

In the present specification, Re(λ) and Rth(λ) represent an in-plane retardation and a retardation in a thickness direction at a wavelength of λ, respectively. Unless specified otherwise, the wavelength λ is 550 nm.

In the present specification, Re(λ) and Rth(λ) are values measured at a wavelength of λ using AxoScan (manufactured by Axometrics Inc.). By inputting an average refractive index ((nx+ny+nz)/3) and a film thickness (d (μm)) in AxoScan, the following expressions can be calculated.

Slow axis direction (°)

$$Re(\lambda) = R0(\lambda)$$

$$Rth(\lambda) = ((nx+ny)/2 - nz) \times d$$

R0(λ) is expressed as a numerical value calculated by AxoScan and represents Re(λ) but means Re(λ).

In the present specification, the refractive indexes nx, ny, and nz are measured using an Abbe refractive index (NAR-4T, manufactured by Atago Co., Ltd.) and a sodium lamp (λ=589 nm) as a light source. In a case where wavelength dependency is measured, a multi-wavelength Abbe refractometer DR-M2 (manufactured by Atago Co., Ltd.) can be used in combination with an interference filter.

In addition, values from the Polymer Handbook (John Wiley & Sons, Inc.) and catalogs of various optical films can be used. Examples of average refractive index values of main optical films are as follows: cellulose acylate (1.48), cycloolefin polymer (1.52), polycarbonate (1.59), polymethyl methacrylate (1.49), and polystyrene (1.59).

In the present specification, visible light refers to light which can be observed by human eyes among electromagnetic waves and refers to light in a wavelength range of 380 nm to 780 nm. Invisible light refers to light in a wavelength range of shorter than 380 nm or longer than 780 nm.

In addition, although not limited thereto, in visible light, light in a wavelength range of 420 to 490 nm is blue light, light in a wavelength range of 495 to 570 nm is green light, and light in a wavelength range of 620 to 750 nm is a red light.

<Organic Electroluminescent Display Device>

FIG. 1 conceptually shows an example of an organic electroluminescent display device according to an embodiment of the present invention. In the following description, the organic electroluminescent display device is also referred to as an organic EL display device.

An organic EL display device 10 according to an embodiment of the present invention shown in FIG. 1 has a polarizer 12, a phase difference layer 14, a circularly polarized light separating layer 16, and an organic electroluminescent light emitting element 18 in this order from a viewing side. In the following description, the organic electroluminescent light emitting element is also referred to as an organic EL light emitting element.

An antireflection film is constituted of the polarizer 12 and the phase difference layer 14, and the optical laminate film according to the embodiment of the present invention is constituted of the polarizer 12, the phase difference layer 14, and the circularly polarized light separating layer 16.

In the organic EL display device 10 (optical laminate film) of the embodiment of the present invention, the circularly polarized light separating layer 16 is provided in addition to the polarizer 12 and the phase difference layer 14, and a cholesteric liquid crystal layer is used as the circularly polarized light separating layer 16. According to the present invention, by adopting such a configuration, it is possible to improve display brightness in the organic EL display device 10, to promote extension of the lifetime of the organic EL element, and to suppress reflection of external light.

The circularly polarized light separating layer 16 is a cholesteric liquid crystal layer. Specifically, the cholesteric liquid crystal layer is a layer having a cholesteric liquid crystal structure formed by fixing a cholesteric liquid crystalline phase. As is well known, a cholesteric liquid crystal layer selectively reflects a specific circularly polarized light component in a specific wavelength range.

In the present invention, the selective reflection center wavelength of the circularly polarized light separating layer 16 is not limited, but the circularly polarized light separating layer 16 (cholesteric liquid crystal layer) preferably has a selective reflection center wavelength in a blue light wavelength range. That is, it is preferable that the circularly polarized light separating layer 16 selectively reflects blue light. Specifically, it is more preferable that the circularly polarized light separating layer 16 has a selective reflection center wavelength in a range of 430 to 480 nm.

The circularly polarized light separating layer 16, which is a cholesteric liquid crystal layer, is substantially a C-plate since the chirality of the cholesteric liquid crystal phase is averaged for light outside the selective reflection range. In addition, since the cholesteric liquid crystal layer has a so-called short wave shift (blue shift) in which the light incident from an oblique direction has a reflection range that varies to the short wavelength side, a cholesteric liquid crystal layer which reflects blue light at the front functions as a C-plate in the visible range in the oblique direction.

Further, it is possible to suppress a reduction in antireflection effect in the front direction as much as possible by reflecting only blue light in the front direction. This is because the influence on brightness is small.

In addition, since there is a difference in energy required to emit light of each color in the organic EL light emitting element, generally, the deterioration of a blue light emitting element is faster than the deterioration of green light and red light emitting elements. Therefore, in consideration of the service life of the blue light emitting element, countermeasures such as suppressing the light emission amount (output) of the light emitting element of each color are taken. On the other hand, by providing the circularly polarized light separating layer that selectively reflects blue light, the brightness of blue light can be improved, and the overall display brightness can be improved. Also, the service life of the blue light emitting element, which is rapidly deteriorated, can be extended and thus the service life of the organic EL display device can be extended.

That is, in the organic EL display device 10 according to the embodiment of the present invention, the circularly polarized light separating layer 16 which is a cholesteric liquid crystal layer with blue light as a selective reflection center wavelength is arranged between the polarizer 12 and the phase difference layer 14, and the organic EL light emitting element 18 (organic EL light emitting element substrate) as a preferable embodiment.

Here, a combination of using a +A-plate of which Rth (550) has a positive value or a B-plate of which Rth(550) has a positive value as the phase difference layer 14, and a cholesteric liquid crystal layer formed of a disk-like liquid crystal compound as the cholesteric liquid crystal layer of the circularly polarized light separating layer 16 is more preferable. This is because the cholesteric liquid crystal layer formed of a disk-like liquid crystal compound functions as a +C-plate outside the reflection range. Further, the phase difference layer 14 (λ/4 film) preferably has reciprocal wavelength dispersibility.

Alternatively, a combination of using a −A-plate of which Rth(550) has a negative value or a B-plate of which Rth (550) has a negative value as the phase difference layer 14 and a cholesteric liquid crystal layer formed of a rod-like liquid crystal compound as the cholesteric liquid crystal layer of the circularly polarized light separating layer 16 is also preferable. This is because the cholesteric liquid crystal layer formed of a rod-like liquid crystal compound functions as a −C-plate outside the reflection range.

The A-plate, the B-plate, and the C-plate will be described later in detail.

[Polarizer]

The polarizer 12 may be a linear polarizer (linearly polarizing plate) having a transmission axis (polarization axis) in one direction and having a function of converting natural light into a specific linearly polarized light. As the polarizer 12, for example, various polarizers used for constituting antireflection layers can be used in various organic EL display devices.

Accordingly, for example, as the polarizer 12, any of an iodine-based polarizing plate, a dye-based polarizing plate using a dichroic dye, and a polyene-based polarizing plate can be used. The iodine-based polarizing plate and the dye-based polarizing plate are generally prepared by adsorbing iodine or a dichroic dye into polyvinyl alcohol and stretching the polyvinyl alcohol.

The polarizer 12 and the phase difference layer 14 described later are arranged such that an angle formed between the transmission axis (absorption axis) of the polarizer 12 and the slow axis of the phase difference layer 14 is 45°±5°.

Here, the polarizer 12 is arranged such that the direction of the transmission axis coincides with the direction of linearly polarized light emitted from the phase difference layer 14. Alternatively, the direction of the slow axis of the phase difference layer 14 described later is adjusted depending on the direction of circularly polarized light reflected by the circularly polarized light separating layer 16, so that the direction of linearly polarized light emitted by itself coincides with the transmission axis of the polarizer 12.

[Phase Difference Layer]

(Ranges of Retardation Re and Rth)

Regarding the in-plane retardation (Re(λ)) of the phase difference layer 14 in the present invention, from the viewpoint of antireflection, the range of Re(550) is 120 to 160 nm, preferably 125 to 155 nm, and more preferably 130 to 150 nm.

In addition, in consideration of combination with the circularly polarized light separating layer 16 (cholesteric liquid crystal layer), from the viewpoint of antireflection in the oblique direction, the absolute value of Rth(550) of the phase difference layer 14, which is a retardation in the thickness direction, is preferably 50 to 200 nm, more preferably 55 to 180 nm, and even more preferably 60 to 160 nm.

The phase difference layer 14 may be a single layer or a laminate of two or more layers. The phase difference layer 14 is preferably a laminate of two or more layers.

In a case where the phase difference layer 14 is a laminate of two or more layers, the slow axis when the plurality of layers are regarded as one layer may be arranged at 45°±10° with the transmission axis of the polarizer 12. For example, even in a case where a polarizer, a λ/2 plate, and a λ/4 plate are laminated in this order, this laminate can be regarded as a laminate of the polarizer and the phase difference layer described above. In this case, the polarizer, the λ/2 plate, and the λ/4 plate may be arranged such that the slow axis of the λ/2 plate is at 12.5°±10° and the slow axis of the λ/4 plate is at 72.5°±10° with respect to the transmission axis of the polarizer, and in a case where the polarizer, the λ/2 plate, and the λ/4 plate are arranged at these angles, the angle of the slow axis of the phase difference layer can be considered to be 45°±10° with respect to the absorption axis of the polarizer. That is, in this case, it is sufficient that the polarizer, the λ/2 plate, and the λ/4 plate are combined to form a circularly polarizing plate as a whole.

In addition, as necessary, the phase difference layer 14 may be formed on a substrate such as a glass substrate and a resin film. Further, the phase difference layer 14 may be formed on an alignment film formed on the substrate, as necessary.

The phase difference layer 14 is preferably a λ/4 film (λ/4 plate). Particularly, the λ/4 film more preferably includes one or more layers of phase difference films including at least one liquid crystal compound formed by polymerizing a liquid crystal monomer forming a phase difference film, a nematic liquid crystal layer, or a smectic liquid crystal layer. The phase difference film may be optically substantially uniaxial or substantially biaxial. Examples of the liquid crystal compound include a disk-like liquid crystal compound and a rod-like liquid crystal compound.

Among these, the phase difference layer 14 is even more preferably λ/4 film formed of a polymerizable liquid crystal compound.

With regard to the phase difference film, it is possible to select a phase difference film that is stretched in a transport direction, is stretched in a direction perpendicular to the transport direction, or is stretched at 45°±10° with respect to the transport direction at the time of film production. In consideration of productivity, a phase difference film obtained by stretching a cyclic polyolefin resin (norbornene-based resin) or the like capable of preparing an optical sheet member by a so-called roll-to-roll process at 45°±10°, or a film having a layer obtained by subjecting a transparent film to an alignment treatment, and aligning a liquid crystal compound on the treated surface in a direction of 45°±10° with respect to the transport direction at the time of film production is preferably used.

(A-Plate, B-Plate, and C-Plate)

In the present specification, the definition of an A-plate is as follows.

There are two kinds of A-plates: a positive A-plate (positive A-plate, +A-plate) and a negative A-plate (negative A-plate, −A-plate). When the refractive index in the in-plane slow axis direction of the film (the direction in which the refractive index becomes the maximum in the plane) is nx, the refractive index in a direction orthogonal to the in-plane slow axis in the plane is ny, and the refractive index in the thickness direction is nz, the positive A-plate satisfies the relationship of Expression (A1), and the negative A-plate satisfies the relationship of Expression (A2). Rth of the positive A-plate has a positive value and Rth of the negative A-plate has a negative value.

$$nx > ny \approx nz \quad \text{Expression (A1)}$$

$$ny < nx \approx nz \quad \text{Expression (A2)}$$

The term "≈" includes not only a case in which both are completely the same but also a case in which both are substantially the same. Regarding the term "substantially the same", for example, a case where (ny −nz)×d (where d represents a film thickness) is −10 to 10 nm, and preferably −5 to 5 nm is also included in the term "ny≈nz", and a case where (nx−nz)×d is −10 to 10 nm and preferably −5 to 5 nm is also included in the term "nx≈nz".

All values of nx, ny, and nz of a B-plate are different and there are two kinds of B-plates; a B-plate having a negative Rth value satisfying the relationship of Expression (B1) and a B-plate having a positive Rth value satisfying the relationship of Expression (B2).

$$(nx+ny)/2 > nz \quad \text{Expression (B1)}$$

$$(nx+ny)/2 < nz \quad \text{Expression (B2)}$$

There are two kinds of C-plates: a positive C-plate (positive C-plate, +C-plate) and a negative C-plate (negative C-plate, −C-plate). The positive C-plate satisfies the relationship of Expression (C1), and the negative C-plate satisfies the relationship of Expression (C2). Rth of the positive C-plate has a negative value and Rth of the negative C-plate has a positive value.

$$nz > nx \approx ny \quad \text{Expression (C1)}$$

$$nz < nx \approx ny \quad \text{Expression (C2)}$$

The term "≈" includes not only a case in which both are completely the same but also a case in which both are substantially the same. Regarding the term "substantially the same", for example, a case where (nx−ny)×d (where d represents a film thickness) is 0 to 10 nm and preferably 0 to 5 nm is also included in the term "nx≈ny".

(Reciprocal Wavelength Dispersibility)

From the viewpoint of reducing the tint of reflection, Re of the phase difference layer 14 preferably exhibits reciprocal wavelength dispersibility. The reciprocal wavelength dispersibility refers to a relationship of Re(450)<Re(550)<Re(650).

Specifically, the ratio of Re(450)/Re(550) is preferably in a range of 0.8 to 0.9 and the ratio of Re(650)/Re(550) is preferably in a range of 1.03 to 1.25.

In addition, with regard to the C-plate described later, "the C-plate exhibits reciprocal wavelength dispersibility" refers to a relationship of Rth(450)<Rth(550)<Rth(650).

(Optical Properties of Phase Difference Layer)

The phase difference layer 14 may be optically uniaxial or biaxial.

Since the absolute value of Rth(550) is increased by using the biaxial phase difference layer 14 (B-plate), the number of spiral turns of the cholesteric liquid crystal in the circularly polarized light separating layer 16 described later is increased and thus the brightness of blue light can be increased. That is, by using the biaxial phase difference layer 14, the irradiation amount of blue light can be increased.

On the other hand, in a case of using the biaxial phase difference layer 14, an antireflection function in the oblique direction is reduced due to an increase in the absolute value of Rth(550), and further, the color balance of the display may be lost.

Accordingly, whether or not the phase difference layer 14 is uniaxial or biaxial may be appropriately selected according to the properties required for the organic EL display device 10. According to the investigation of the present inventors, from the viewpoint of the overall balance of the brightness of blue light, the oblique antireflection properties, and the color balance of the display, the phase difference layer 14 is preferably uniaxial (A-plate).

[Circularly Polarized Light Separating Layer]

Although described later, the circularly polarized light separating layer 16 is a cholesteric liquid crystal layer. The cholesteric liquid crystal layer is a layer having a cholesteric liquid crystal structure formed by fixing a cholesteric liquid crystalline phase.

The circularly polarized light separating layer 16 may be formed on a substrate such as a glass substrate and a resin film as necessary. Further, as necessary, the circularly polarized light separating layer 16 may be formed on an alignment film formed on a substrate.

(Cholesteric Liquid Crystal Structure)

A cholesteric liquid crystal structure is known to exhibit selective reflectivity at a specific wavelength. The selective reflection center wavelength λ depends on the pitch P of the spiral structure (=period of spiral) in the cholesteric liquid crystal structure, and follows the relationship of the average refractive index n of the liquid crystal compound forming the cholesteric liquid crystal structure and λ=n×P. Therefore, the reflection center wavelength can be adjusted by adjusting this pitch of the spiral structure. Specifically, one pitch of the spiral structure in the cholesteric liquid crystal structure is the length of the cholesteric liquid crystal layer in the thickness direction in a case where the direction of the director of the liquid crystal compound forming the cholesteric liquid crystal structure is rotated by 360°.

Since the pitch of the cholesteric liquid crystal structure depends on the kind of chiral agent used together with a polymerizable liquid crystal compound in a case of forming the circularly polarized light separating layer 16, or the concentration of addition of the chiral agent, a desired pitch can be obtained by adjusting the kind of chiral agent and the concentration.

Regarding the adjustment of the pitch, a detailed description is given in Fuji Film Research & Development, No. 50 (2005), p. 60 to 63. Regarding the method for measuring the sense or pitch of a spiral, the methods described in "Ekisho Kagaku Jikken Nyumon (Introduction to Experiments in Liquid Crystal Chemistry)", edited by Japanese Liquid Crystal Society, published by Sigma Shuppan K. K., 2007, p. 46; and "Ekisho Benran (Handbook of Liquid Crystals)", Editorial Committee for the Handbook of Liquid Crystals, Maruzen, Inc., p. 196, can be used.

The problem of the present invention is a problem found in a case of producing a cholesteric liquid crystal layer that selectively reflects blue light, but is a problem that occurs in a cholesteric liquid crystal layer in general. The present invention can be applicable regardless of the selective wavelength.

(Selective Reflection Center Wavelength)

In the present invention, the selective reflection center wavelength (the center wavelength of the selective reflection wavelength range) and the half-width of the circularly polarized light separating layer 16 (cholesteric liquid crystal layer) can be obtained as follows.

In a case where the transmission spectrum of the circularly polarized light separating layer is measured using a spectrophotometer UV3150 (manufactured by Shimadzu Corporation), the decreasing peak of the transmittance is observed in the selective reflection range. In a case where, in two wavelengths which have a transmittance of ½ of the height of the highest peak, a value of a wavelength on a short wavelength side is set to λ1 nm, and a value of a wavelength on a long wavelength side is set to λ2 nm, the selective reflection center wavelength and a half-width Δλ can be represented by the following expressions.

Selective reflection center wavelength=(λ1+λ2)/2

Half-width=(λ2−λ1)

The cholesteric liquid crystal structure gives a striped pattern of bright parts and dark parts in a cross-sectional image vertical to the formation surface of the circularly polarized light separating layer 16 as measured by a scanning electron microscope (SEM). Two repeated sets of the bright parts and the dark parts (three bright parts and two dark parts) correspond to one pitch of the spiral (one spiral turn). From this, the number of spiral turns of the cholesteric liquid crystal layer can be measured from a SEM cross-sectional view. The normal line of each line of the striped pattern is the direction of the spiral axis of the cholesteric liquid crystal structure.

(Method for Preparing Cholesteric Liquid Crystal Structure)

The cholesteric liquid crystal structure can be obtained by fixing a cholesteric liquid crystalline phase. The structure in which a cholesteric liquid crystalline phase is fixed may be a structure in which the alignment of the liquid crystal compound that forms the cholesteric liquid crystalline phase is retained, and typically, the structure may be a structure in which a layer lacking fluidity is formed by bringing a polymerizable liquid crystal compound into an aligned state of the cholesteric liquid crystalline phase and then polymerizing and curing the polymerizable liquid crystal compound by ultraviolet irradiation, heating or the like, and simultaneously the state is changed into a state that is free of any factor causing a change in the alignment state by an external field or an external force. Meanwhile, in the structure obtained by fixing the cholesteric liquid crystalline phase, it is sufficient that the optical properties of the cholesteric liquid crystalline phase are retained, and the liquid crystal compound may not exhibit liquid crystallinity any longer. For example, the polymerizable liquid crystal compound may be macromolecularized by a curing reaction and thereby may no longer have liquid crystallinity.

The material used for forming the cholesteric liquid crystal structure may be a liquid crystal composition including a liquid crystal compound. The liquid crystal compound is preferably a polymerizable liquid crystal compound.

The liquid crystal composition including a polymerizable liquid crystal compound further includes a surfactant, a chiral agent, a polymerization initiator, and the like. Examples of the surfactant, the chiral agent, and the polymerization initiator include compounds described in JP2016-197219A.

The polymerizable liquid crystal compound may be a rod-like liquid crystal compound or a disk-like liquid crystal compound. As described above, it is preferable that the phase difference layer 14 has reciprocal wavelength dispersibility, and from the viewpoint of being capable of suitably setting the total retardation Rth(550) in the thickness direction of members arranged between the polarizer 12 and the organic EL light emitting element 18 described later in a case where the reciprocal wavelength dispersibility of the phase difference layer 14 is used, a disk-like liquid crystal compound is suitably used.

Examples of the polymerizable group include an acryloyl group, a methacryloyl group, an epoxy group, and a vinyl group. The alignment of the liquid crystal compound can be fixed by curing the polymerizable liquid crystal compound. The liquid crystal compound having a polymerizable group is preferably a monomer or a relatively low molecular weight liquid crystal compound having a degree of polymerization of less than 100 is preferable.

(Disk-Like Liquid Crystal Compound)

Examples of the disk-like liquid crystal compound include compounds described in JP2007-108732A, JP2010-244038A, JP2013-195630A, JP1998-307208A (JP-H10-307208A), and JP2000-171637A. Generally, in JP2013-195630A, it is described that the disk-like liquid crystal compound is preferably a compound having a triphenylene structure. On the other hand, since a disk-like liquid crystal compound having a tri-substituted benzene structure has a higher Δn than a disk-like liquid crystal compound having a triphenylene structure, and the selective reflection wavelength range can be widened, the compound can be appropriately selected as necessary.

(Rod-Like Liquid Crystal Compound)

As the rod-like liquid crystal compound, azomethines, azoxys, cyanobiphenyls, cyanophenyl esters, benzoic acid esters, cyclohexanecarboxylic acid phenyl esters, cyanophenylcyclohexanes, cyano-substituted phenylpyrimidines, alkoxy-substituted phenylpyrimidines, phenyldioxanes, tolanes, and alkenylcyclohexylbenzonitriles are preferably used.

As the rod-like liquid crystal compound which is a polymerizable liquid crystal compound, compounds described in Makromol. Chem., Vol. 190, p. 2255 (1989), Advanced Materials, Vol. 5, p. 107 (1993), U.S. Pat. Nos. 4,683,327A, 5,622,648A, 5,770,107A, WO95/022586A, WO95/024455A, WO97/000600A, WO98/023580A, WO98/052905A, JP1989-272551A (JP-H01-272551A), JP1994-016616A (JP-H06-016616A), JP1995-110469A (JP-H07-110469A), JP1999-080081A (JP-H11-080081A), and JP2001-064627A. Further, as the rod-like liquid crystal compound, for example, compounds described in JP1999-513019A (JP-H11-513019A) and JP2007-279688A can be preferably used.

(Number of Spiral Turns (Number of Spiral Pitches) of Circularly Polarized Light Separating Layer)

In the circularly polarized light separating layer 16 which is a cholesteric liquid crystal layer, the reflectivity of blue light (selective reflection wavelength range) is affected by the number of spiral turns. Specifically, as the number of spiral turns of the cholesteric liquid crystal layer increases, the reflectivity of blue light increases, and thus the brightness of blue light can be increased.

On the other hand, in the circularly polarized light separating layer 16 (cholesteric liquid crystal layer), as the number of spiral turns increases, the absolute value of Rth(550) of the circularly polarized light separating layer 16 increases. As will be described later, in the organic EL display device according to the embodiment of the present invention, the total of Rth(550) of members provided between the polarizer 12 and the organic EL light emitting element 18 is preferably −50 to 50 nm.

Accordingly, the number of spiral turns in the circularly polarized light separating layer 16 may be appropriately set according to the brightness of blue light required, Rth(550) of members provided between the polarizer 12 and the organic EL light emitting element 18, and the like.

From the viewpoint of while maintaining the blue light reflectivity of the circularly polarized light separating layer 16, optimizing Rth(550) of the circularly polarized light separating layer 16, the number of spiral turns of the cholesteric liquid crystal layer is preferably 1.5 to 6.5 pitches (1.5 to 6.5). The control of the number of spiral turns can be performed by controlling the film thickness of the circularly polarized light separating layer 16. In consideration of this point, the film thickness of the circularly polarized light separating layer 16 is preferably 0.4 to 1.8 μm and more preferably 0.8 to 1.3 μm.

(Re of Circularly Polarized Light Separating Layer)

In the organic EL display device 10 (optical laminate film) of the embodiment of the present invention, the circularly polarized light separating layer 16, which is a cholesteric liquid crystal layer, generates Re(550), that is, has an in-plane phase difference.

In a first embodiment of the organic EL display device (optical laminate film) 10 of the present invention, Re(550) of the circularly polarized light separating layer 16, that is, the cholesteric liquid crystal layer is 0.5 to 3.0 nm. In addition, Re(550) of the circularly polarized light separating layer 16 can be measured by AxoScan by the method described above.

Further, since the circularly polarized light separating layer 16 has an in-plane phase difference in the organic EL display device 10 of the embodiment of the present invention, the circularly polarized light separating layer has a slow axis in the plane. In a second embodiment of the organic EL display device 10 (optical laminate film) of the present invention, an angle formed between the slow axis (in-plane slow axis) of the circularly polarized light separating layer 16 and the slow axis (in-plane slow axis) of the phase difference layer 14 is −30° to 30°.

By adopting such a configuration in the present invention, the optical laminate film exhibiting excellent reflection tint and the organic EL display device 10 using this optical laminate film and exhibiting excellent reflection tint when turned off are realized. In addition, the optical film of the first embodiment of the present invention is capable of suppressing minute unevenness, and the organic EL display device of the first embodiment of the present invention is capable of suppressing minute unevenness when turned off.

The present inventors have repeated investigations for improving quality for a configuration in which a circularly polarized light separating layer is provided for improving brightness in an organic EL display device using an antireflection film including a polarizer and a phase difference layer. As a result, it has been found that, when the organic EL display device is turned off, in a case of being viewed from the front, the reflection tint changes (varies) from an intended tint range (for example, black). Furthermore, it has been found that this change in tint is caused by a change in Re(550) of the circularly polarized light separating layer 16, which periodically changes according to the film thickness of the circularly polarized light separating layer.

Figure 3:
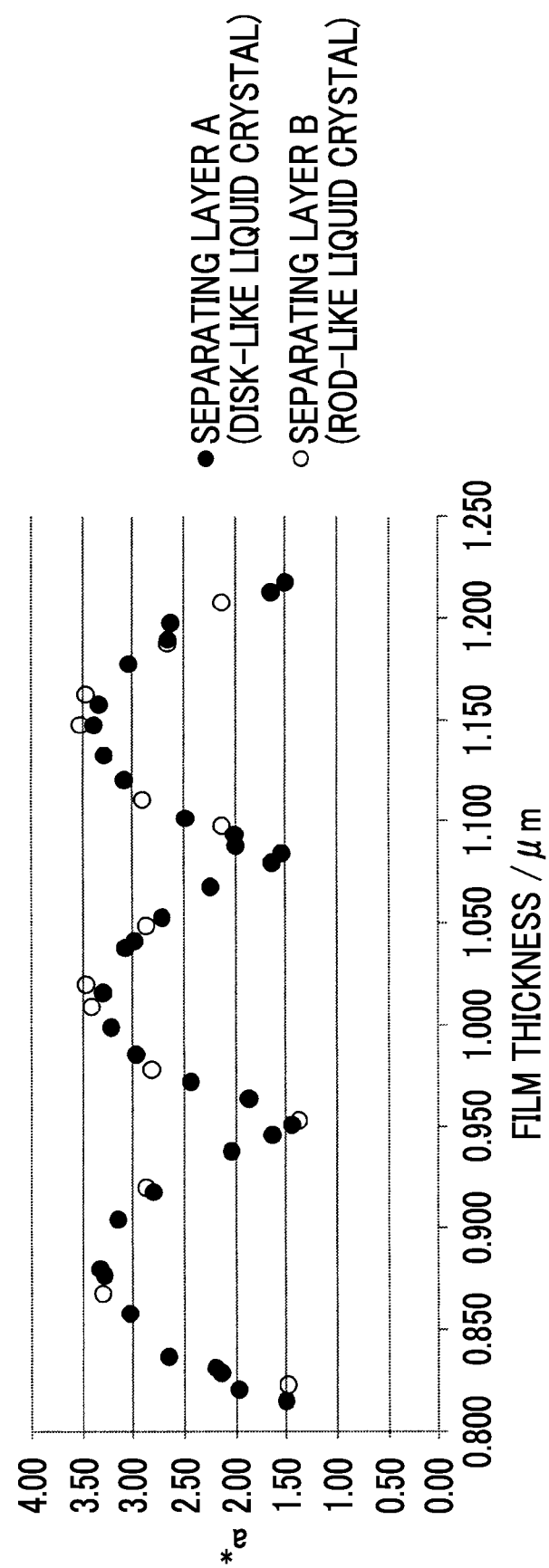
FIG. 3 is a graph showing that the tint periodically changes with respect to the film thickness of a circularly polarized light separating layer.

FIG. 3 shows an example of the relationship between the film thickness of the circularly polarized light separating layer (cholesteric liquid crystal layer) and the tint (chromaticity a*) in a case where the organic EL display device is observed from the front when turned off in the organic EL display device including the polarizer, the phase difference layer, the circularly polarized light separating layer, and the organic EL light emitting element in this order. The details of FIG. 3 will be described later in Examples.

As shown in FIG. 3, the tint (a*) in a case where the organic EL display device is observed from the front when turned off is gradually increased as the film thickness of the circularly polarized light separating layer is increased or decreased, and the tint is gradually decreased with a certain film thickness as the peak and is gradually increased with a certain film thickness as the lowest point. This change is periodically repeated according to the film thickness.

The reason for this change is that Re(550) of the circularly polarized light separating layer periodically changes according to the film thickness of the obtained circularly polarized light separating layer.

Figure 4:
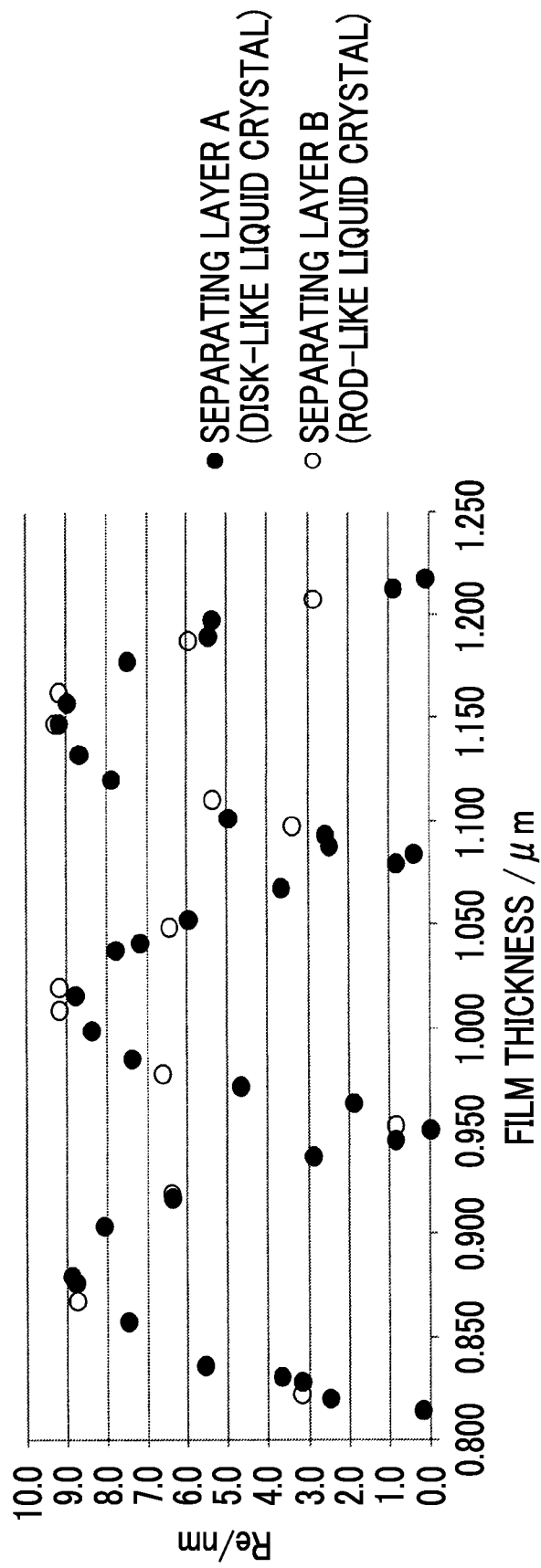
FIG. 4 is a graph showing that Re periodically changes with respect to the film thickness of the circularly polarized light separating layer.

FIG. 4 shows an example of the relationship between the film thickness of the circularly polarized light separating layer (cholesteric liquid crystal layer) constituting the organic EL display device in FIG. 3 and Re(550) of the circularly polarized light separating layer. The details of FIG. 4 will also be described later in Examples.

As shown in FIG. 4, Re(550) of the circularly polarized light separating layer is also gradually increased as the film thickness is increased or decreased, and Re(550) is gradually decreased with a certain thickness as the peak and is decreased with a certain thickness as the lowest point again. This change is periodically repeated according to the film thickness.

As shown in FIGS. 3 and 4, the thickness of the circularly polarized light separating layer at which the tint has the maximum value coincides with the thickness of the circularly polarized light separating layer at which Re(550) has the maximum value, and the thickness of the circularly polarized light separating layer at which the tint has the minimum value also coincides with the thickness of the circularly polarized light separating layer at which Re(550) has the minimum value. That is, the changes of the tint and Re(550) with respect to the thickness of the circularly polarized light separating layer are repeated at the same cycle according to a change in the film thickness.

This is due to the direction of the slow axis (director) of the liquid crystal compound located on the outermost surface of the circularly polarized light separating layer. The outermost surface of the circularly polarized light separating layer is the surface of the circularly polarized light separating layer opposite to the coating surface to which a liquid crystal composition to be the circularly polarized light separating layer is applied.

As described above, in the circularly polarized light separating layer, which is a cholesteric liquid crystal layer, the liquid crystal compound is spirally turned.

In the circularly polarized light separating layer, in a case where the liquid crystal compound is rotated by 360° on the outermost surface, Re(550) is zero. That is, in the circularly polarized light separating layer, in the cholesteric liquid crystal structure that is spirally turned, in a case where the direction of the slow axis of the liquid crystal compound on the lowermost surface coincides with the direction of the slow axis of the liquid crystal compound on the outermost surface, Re(550) is zero. Ideally, the thickness of the circularly polarized light separating layer, that is, the cholesteric liquid crystal layer formed by fixing the cholesteric liquid crystalline phase, is the thickness in a state in which the liquid crystal compound is rotated by 360°.

On the other hand, in a case where the film thickness of the circularly polarized light separating layer is increased from a state in which the liquid crystal compound is rotated by 360°, the liquid crystal compound that is spirally turned is placed thereon. The opposite is true in a case where the circularly polarized light separating layer is thin. As a result, the direction of the slow axis of the liquid crystal compound on the outermost surface of the circularly polarized light separating layer is shifted from the state in which the liquid crystal compound is rotated by 360°. Due to the shift of the slow axis of the liquid crystal compound from the state in which the liquid crystal compound is rotated by 360°, optical anisotropy occurs in the plane of the circularly polarized light separating layer.

As the shift of the slow axis of the liquid crystal compound from the state in which the liquid crystal compound is rotated by 360° becomes greater, the optical anisotropy in the plane of the circularly polarized light separating layer becomes greater and Re(550) increases. That is, in the circularly polarized light separating layer, Re(550) becomes maximum in a state in which the direction of the slow axis of the liquid crystal compound on the outermost surface is rotated by 90° from the state in which the direction of the slow axis of the liquid crystal compound is rotated by 360°. For example, in the example shown in FIG. 4, an Re(550) of about 9 nm at maximum is generated.

Further, since the direction of the slow axis of the liquid crystal compound coincides with the state in which the direction of the slow axis of the liquid crystal compound is rotated by 360° every time the liquid crystal compound on the outermost surface of the circularly polarized light separating layer is rotated by 180°, the in-plane optical anisotropy is canceled and Re(550) is zero. However, when the rotation is less than 180°, the in-plane optical anisotropy cannot be completely canceled, and Re(550) is generated.

That is, a period of an increase or decrease in Re(550) with respect to the film thickness of the circularly polarized light separating layer is almost equal to ½ of the spiral pitch of the cholesteric liquid crystal structure in the circularly polarized light separating layer (cholesteric liquid crystal layer).

It is considered that in the organic EL display device in which the circularly polarized light separating layer is combined with the antireflection film including the polarizer and the phase difference layer, Re(550), that is, the phase difference of the circularly polarized light separating layer thus generated affects the optical performance combined with the antireflection layer, and the tint of the organic EL display device when turned off is changed from the intended tint.

That is, in the organic EL display device including the polarizer, the phase difference layer, the circularly polarized light separating layer, and the organic EL light emitting element in this order, the change in Re(550) corresponding to the thickness of the circularly polarized light separating layer corresponds to a change in tint to be improved when the organic EL display device is turned off. In addition, since the circularly polarized light separating layer has Re, the circularly polarized light incident on the antireflection film varies from the appropriate circularly polarized light, and the antireflection function of the antireflection film is also reduced.

The present invention has been made by obtaining such knowledge, in the first embodiment, in the optical laminate film including the polarizer 12, the phase difference layer 14, and the circularly polarized light separating layer 16 in this order, and in the organic EL display device 10 indulging the polarizer 12, the phase difference layer 14, the circularly polarized light separating layer 16, and the organic EL light emitting element 18 in this order, Re(550) of the circularly polarized light separating layer 16 is set to 0.5 to 3.0 nm.

By adopting such a configuration in the present invention, an optical laminate film exhibiting excellent reflection tint and antireflection performance, and an organic EL display device 10 using this optical laminate film and exhibiting excellent reflection tint when turned off and antireflection performance are realized by suppressing a change in tint from the intended tint due to Re(550) of the circularly polarized light separating layer 16, suppressing minute color unevenness, and further, suppressing a decrease in antireflection performance of the antireflection film.

In the first embodiment of the present invention, in a case where Re(550) of the circularly polarized light separating layer 16 is more than 3.0 nm, there is a possibility that defects that the tint of the organic EL display device when turned off significantly changes from the intended tint, and the like may be caused.

In the first embodiment of the present invention, Re(550) of the circularly polarized light separating layer 16 is 0.5 nm or more.

The first embodiment of the present invention in which the circularly polarized light separating layer 16 has such a lower limit of Re(550) is suitably used for a small image display device (display) of a smartphone or the like and corresponds to an image display device, particularly, an organic EL display device, of preferably 7 inches or less, more preferably 6 inches or less, even more preferably 5.5 inches or less.

Unlike a large image display device, a small image display device allows a user to observe an image at a close distance.

As described above, the circularly polarized light separating layer 16 is formed by a coating method. Therefore, unlike a large image display device, in a case of a small image display device, even in a case where the film thickness varies, a variation in the film thickness of the circularly polarized light separating layer 16 on the entire screen is small, and a change in Re(550) caused by the film thickness, that is, the color unevenness when the display device is turned off is also small. Further, in a case of a small image display device that performs observation at a close distance, gentle color unevenness on the entire display screen is not noticeable.

On the other hand, although gentle color unevenness is not a problem in a large image display device that performs observation at a long distance, in a small image display device that performs observation at a close distance, fine color unevenness in the display screen is easily visually recognized, and in a case where there is fine color unevenness in the screen when the display device is turned off, fine color unevenness in the screen is highly noticeable. Fine reflection unevenness also causes fine color unevenness.

That is, a large image display device and a small image display device have different color unevenness that is noticeable when the display device is turned off and affects quality, and in the small image display device, fine color unevenness and reflection unevenness in the screen have a significant problem in quality.

Figure 5:
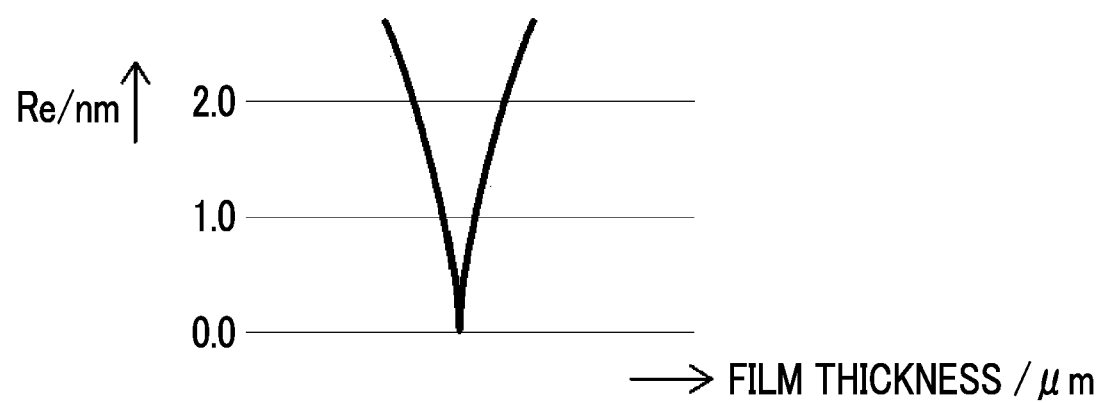
FIG. 5 is a view conceptually showing a region in which Re in FIG. 4 is low.

FIG. 5 conceptually shows a change in Re(550) in a region in which Re(550) is small in the relationship between the film thickness and Re(550) in the circularly polarized light separating layer 16 shown in FIG. 4.

As shown in FIGS. 4 and 5, in a region in which Re(550) of the circularly polarized light separating layer 16 is less than 0.5 nm, the ratio of a variation of Re to a change in the film thickness is very large.

That is, as shown in FIGS. 4 and 5, in the region where Re(550) of the circularly polarized light separating layer 16 is less than 0.5 nm, the change in Re(550) is sharply decreased according to the change in the film thickness, is turned up at 0 nm (near 0 nm) and is sharply increased. Therefore, in the region in which Re(550) is less than 0.5 nm, the ratio of a variation in Re(550) with respect to a change in film thickness is very large as compared with other regions. That is, in the region in which Re(550) of the circularly polarized light separating layer 16 is less than 0.5 nm, even in a case where the film thickness slightly varies, a change in Re(550) is large as compared with a region in which Re(550) is 0.5 nm or more.

For example, in the circularly polarized light separating layer 16, there is a possibility that fine film thickness unevenness may be formed due to various causes such as fine unevenness on the formation surface and slight coating unevenness.

In the region in which Re(550) of the circularly polarized light separating layer 16 is 0.5 nm or more, even in a case where the film thickness slightly changes, the variation in Re(550) with respect to the change in the film thickness is small, and thus the fine film thickness unevenness does not cause a problem. However, as described above, in the region in which Re(550) of the circularly polarized light separating layer 16 is less than 0.5 nm, Re(550) significantly varies even with slight film thickness unevenness, and thus the tint of the organic EL display device when turned off is varied by the variation in Re(550) to cause fine color unevenness.

Such fine color unevenness is not noticeable and does not cause a problem in a large image display device having a long observation distance. However, in a small image display device that performs observation at a close distance, on the contrary, fine color unevenness is highly noticeable and causes a great deterioration in quality.

From the viewpoint of a change of the tint from the intended tint when the display device is turned off, it is preferable that Re(550) of the circularly polarized light separating layer 16 is small.

However, although Re(550) is set to be small and the tint when the organic EL display device is turned off is set to the intended tint, even in a case where the color unevenness is noticeable when the display device is turned off, the quality becomes very poor.

In contrast, in the present invention, by using the region where Re(550) of the circularly polarized light separating layer 16 is 0.5 nm or more, even in a case where the tint when the display device is turned off is sacrificed and is extremely small, fine color unevenness in the screen when the display device is turned off is removed to realize an optical laminate film exhibiting more excellent reflection tint and high quality, and an organic EL display device.

In the first embodiment of the present invention, Re(550) of the circularly polarized light separating layer 16 is 0.5 to 3.0 nm, but Re(550) of the circularly polarized light separating layer 16 is preferably 0.5 to 2.0 nm and more preferably 0.5 to 1.5 nm.

(Angle Formed Between Slow Axis of Circularly Polarized Light Separating Layer and Slow Axis of Phase Difference Layer)

As described above, Re(550) is generated in the circularly polarized light separating layer 16 which is a cholesteric liquid crystal layer. Therefore, the circularly polarized light separating layer 16 has a phase difference, that is, has a slow axis in the plane. As described above, in the second embodiment of the present invention, the angle formed between the slow axis of the circularly polarized light separating layer 16 and the slow axis of the phase difference layer 14 is −30° to 30°.

The second embodiment of the present invention is also suitably used for a small image display device (display) of a smartphone or the like and corresponds to an image display device, particularly, an organic EL display device, of preferably 7 inches or less, more preferably 6 inches or less, and even more preferably 5.5 inches or less.

In such a small image display device, particularly, an organic EL display device, in a case where the tint when the display device is turned off varies from the intended tint, the quality is significantly reduced.

Here, as described above, Re(550) is generated in the plane in the circularly polarized light separating layer which is a cholesteric liquid crystal layer. That is, the circularly polarized light separating layer has an in-plane phase difference. Therefore, the circularly polarized light separating layer has a slow axis in the plane.

The change in the tint of the organic EL display device from the intended tint when turned off due to the generation of Re(550) in the circularly polarized light separating layer significantly varies at the angle formed between the slow axis of the circularly polarized light separating layer and the slow axis of the phase difference layer.

Specifically, as the angle formed between the slow axis of the circularly polarized light separating layer and the slow axis of the phase difference layer becomes smaller, the change in the tint of the organic EL display device when turned off can be further suppressed.

The second aspect of the present invention has been made by obtaining such knowledge, and optical laminate film including the polarizer 12, the phase difference layer 14, and the circularly polarized light separating layer 16 in this order, and in the organic EL display device 10 indulging the polarizer 12, the phase difference layer 14, the circularly polarized light separating layer 16, and the organic EL light emitting element 18 in this order, the angle formed between the slow axis of the circularly polarized light separating layer 16 and the slow axis of the phase difference layer 14 is −30° to 30°.

Since the organic EL display device 10 (optical laminate film) of the embodiment of the present invention has such a configuration, even in a case where Re(550) generated in the circularly polarized light separating layer 16 is large, the change in the tint from to the intended tint when the organic EL display device is turned off, caused by the generation of Re(550) in the circularly polarized light separating layer 16, can be suppressed in an allowable range. In addition, since Re(550) of the circularly polarized light separating layer can be canceled, a decrease in the antireflection function of the antireflection film can be suppressed.

The angle formed between the slow axis of the circularly polarized light separating layer 16 and the slow axis of the phase difference layer 14 shows a state in which the slow axis of the circularly polarized light separating layer 16 is clockwise with respect to the slow axis of the phase difference layer 14 as a positive value when the optical laminate film in which the polarizer 12, the phase difference layer 14 and the circularly polarized light separating layer 16 are laminated is viewed from the circularly polarized light separating layer 16 side.

The slow axis of the circularly polarized light separating layer 16, that is, the cholesteric liquid crystal layer can be measured by AxoScan described above.

In a case where the angle formed between the slow axis of the circularly polarized light separating layer 16 and the slow axis of the phase difference layer 14 exceeds a range of −30° to 30°, there is a possibility that defects that the tint of the organic EL display device when the organic EL display device is turned off significantly changes from the intended tint may be caused.

The angle formed between the slow axis of the circularly polarized light separating layer 16 and the slow axis of the phase difference layer 14 is preferably −20° to 20° and more preferably −10° to 10°.

In the above-described first aspect of the present invention, the angle formed between the slow axis of the circularly polarized light separating layer 16 and the slow axis of the phase difference layer 14 is not limited, but also in the first aspect of the present invention, the angle formed between the slow axis of the circularly polarized light separating layer 16 and the slow axis of the phase difference layer 14 preferably satisfies the range of the second embodiment of the present invention.

As described above, in the present invention, the circularly polarized light separating layer 16 has Re(550).

In the second embodiment of the present invention, Re(550) of the circularly polarized light separating layer 16 is not limited, but is preferably 0.5 nm or more in consideration of generation of a slow axis and the like. Re(550) of the circularly polarized light separating layer 16 is preferably equal to or less than ReMax [nm] calculated from the selective reflection center wavelength of the circularly polarized light separating layer 16, the average refractive index n of the liquid crystal compound forming the circularly polarized light separating layer 16, and the birefringence $\Delta n$ of the liquid crystal compound forming the circularly polarized light separating layer 16.

Specifically, ReMax can be calculated by $$\text{ReMAX [nm]} = k \times \Delta n \times \lambda / n$$

In the above expression, k represents a proportionality constant calculated by performing an experiment or the like and is "k=0.213".

In the second embodiment of the present invention, Re(550) of the circularly polarized light separating layer 16 is preferably 0.5 to 3.0 nm, more preferably 0.5 to 2.0 nm, and even more preferably 0.5 to 1.5 nm. That is, in the second embodiment of the present invention, Re(550) of the circularly polarized light separating layer 16 preferably satisfies the above-described range of the first embodiment of the present invention.

As shown in the above expression, the maximum value (ReMAX) of Re(550) generated in the circularly polarized light separating layer 16 is proportional to $\Delta n$ of the liquid crystal compound used for forming the circularly polarized light separating layer 16. In the present invention, there is an advantage that as $\Delta n$ of the liquid crystal compound becomes larger, the selective reflection wavelength range can be made wider. In consideration of this point, it is preferable to use a liquid crystal compound having a $\Delta n$ of 0.1 to 0.2 for the circularly polarized light separating layer 16, and in this case, the maximum value of Re(550) is 6 to 12 nm.

(Combination of Re of Circularly Polarized Light Separating Layer and Angle Between Slow Axes of Circularly Polarized Light Separating Layer and Phase Difference Layer)

As described above, since the tint at the time of turn-off when the organic EL display device 10 is viewed from the front, which is the problem of the present invention, is affected by not only Re of the circularly polarized light separating layer 16 but also the angle formed between the slow axis of the circularly polarized light separating layer 16 and the slow axis of the phase difference layer 14 (hereinafter, also referred to as an angle (θ)), even in a case where Re of the circularly polarized light separating layer is 3 nm or more and the angle (θ) is outside a range of −30° to 30°, it is possible to suppress a change in the tint from the intended tint when the organic EL display device 10 is turned off in an allowable range depending on the combination.

In the present invention, the absolute value of Re nm×θ° is preferably 300 or less, more preferably 150 or less, and even more preferably 50 or less.

(Other Examples of Selective Reflection Center Wavelength of Circularly Polarized Light Separating Layer)

In the above example, the circularly polarized light separating layer 16 has the selective reflection center wavelength in a wavelength range of blue light, and preferably in a wavelength range of 430 to 480 nm, but the present invention is not limited thereto.

That is, for example, as the selective reflection center wavelength of the circularly polarized light separating layer 16 (cholesteric liquid crystal layer), various light wavelength ranges such as ultraviolet rays, green light, red light, and infrared rays can be used according to a color of which brightness is to be improved in the organic EL display device, a color of which the occurrence of tint in a case of oblique observation is to be suppressed, and the like.

As an example, a circularly polarized light separating layer 16 having a selective reflection center wavelength in a wavelength range of 700 to 800 nm is exemplified.

[Preferable Combination of Phase Difference Layer 14 and Circularly Polarized Light Separating Layer 16]

(Total of Rth of Members Provided Between Polarizer and Organic EL Light Emitting Element)

In the organic EL display device 10 according to the embodiment of the present invention, the total of Rth(550) of members which are provided between the polarizer 12 and the organic EL light emitting element 18 is preferably −50 to 50 nm (±50 nm). In other words, in the organic EL display device according to the embodiment of the present invention, the absolute value of the total of Rth(550) of members which are provided between the polarizer 12 and the organic EL light emitting element 18 is preferably 50 nm or less.

From the viewpoint of enhancing the antireflection function in the oblique direction, the total of Rth(550) of the members provided between the polarizer 12 and the organic EL light emitting element 18 is more preferably −40 to 40 nm, even more preferably −20 to 20 nm, and particularly preferably −10 to 10 nm.

Particularly, in a case where a C-plate is arranged between the polarizer 12 and the organic EL light emitting element 18, the total of Rth(550) of members which are provided between the polarizer 12 and the organic EL light emitting element 18 is preferably −20 to 20 nm and more preferably −10 to 10 nm.

That is, in the organic EL display device 10 shown in FIG. 1, the total of Rth(550) of the phase difference layer 14 and Rth(550) of the circularly polarized light separating layer 16 is preferably −50 to 50 nm.

With such a configuration, a good antireflection function in the oblique direction can be realized.

Accordingly, as one preferable combination of the phase difference layer 14 and the circularly polarized light separating layer 16, as described above, a combination of a +A-plate having reciprocal wavelength dispersibility, of which Rth(550) has a positive value, or a B-plate having reciprocal wavelength dispersibility, of which Rth(550) has a positive value, and a circularly polarized light separating layer 16 (cholesteric liquid crystal layer) that substantially functions as a +C-plate in the visible light range, has a negative Rth(550) value, and is formed of a disk-like liquid crystal compound is exemplified.

In addition, as another example of a preferable combination of the phase difference layer 14 and the circularly polarized light separating layer 16, as described above, a combination of a −A-plate having forward wavelength dispersibility, of which Rth(550) has a negative value, or a B-plate having forward wavelength dispersibility, of which Rth(550) has a negative value, and a circularly polarized light separating layer 16 (cholesteric liquid crystal layer) that substantially functions as a −C-plate in the visible light range, has a positive Rth(550) value, and is formed of a rod-like liquid crystal compound is exemplified.

(C-Plate Additionally Used as Necessary)

In the organic EL display device according to the embodiment of the present invention, since the total of Rth(550) of the members which are provided between the polarizer 12 and the organic EL light emitting element 18 is set to −50 to 50 nm and an antireflection function, particularly, an antireflection function in the oblique direction is achieved, as necessary, a C-plate may be added between the polarizer 12 and the organic EL light emitting element 18.

As described above, in the circularly polarized light separating layer 16 which is a cholesteric liquid crystal layer, as the number of spiral turns of the cholesteric liquid crystal layer increases, the reflectivity of blue light increases, and thus the brightness of blue light can increase.

In contrast, in a case where the number of spiral turns of the circularly polarized light separating layer 16 increases (for example, in a case where the number of spiral turns is 6 or more), the absolute value of Rth(550) of the circularly polarized light separating layer 16 increases and thus it becomes difficult to set the total of Rth(550) of the members, which are provided between the polarizer 12 and the organic EL light emitting element 18, in combination with the phase difference layer 14 to be in a range of −50 to 50 nm in some cases.

On the other hand, according to the combination of the phase difference layer 14 and the circularly polarized light separating layer 16, by providing a −C-plate of which Rth(550) has a positive value or a +C-plate of which Rth(550) has a negative value between the polarizer 12 and the organic EL light emitting element 18, regardless of Rth(550) of the phase difference layer 14 and the circularly polarized light separating layer 16, the total (sum) of Rth (550) of the members, which are provided between the polarizer 12 and the organic EL light emitting element 18, can be set to −50 to 50 nm.

As an example, as described above, in a case of using the phase difference layer 14 formed of the +A-plate having reciprocal wavelength dispersibility, of which Rth(550) has a positive value, or the B-plate having reciprocal wavelength dispersibility, of which Rth(550) has a positive value, and the circularly polarized light separating layer 16 (cholesteric liquid crystal layer) that substantially functions as a +C-plate in the visible light range, has a negative Rth(550) value, and is formed of a disk-like liquid crystal compound, a −C-plate of which Rth(550) has a positive value is provided between the polarizer 12 and the organic EL light emitting element 18.

In addition, as described above, in a case of using the phase difference layer 14 formed of the −A-plate having forward wavelength dispersibility, of which Rth(550) has a negative value, or the B-plate having forward wavelength dispersibility, of which Rth(550) has a negative value, and the circularly polarized light separating layer 16 that substantially functions as a −C-plate in the visible light range, has a positive Rth(550) value, and is formed of a rod-like liquid crystal compound, a +C-plate of which Rth(550) has a negative value is provided between the polarizer 12 and the organic EL light emitting element 18.

By using such a C-plate, the total of Rth(550) of members between the polarizer 12 and the organic EL light emitting element 18 can be adjusted with a high degree of freedom.

Therefore, by using the C-plate, the number of spiral turns of the circularly polarized light separating layer 16 is increased, the reflectivity of blue light is improved by the circularly polarized light separating layer 16, the brightness of blue light is sufficiently increased, and then the absolute value of the total of Rth(550) of members which are provided between the polarizer 12 and the organic EL light emitting element 18 is made very small. Thus, the antireflection function in the oblique direction can be improved.

That is, in the organic EL display device according to the embodiment of the present invention, in a case where there is no problem in the thickness of the organic EL display device, the complexity of the layer configuration between the polarizer 12 and the organic EL light emitting element 18, the cost, the productivity, and the like, from the viewpoint of performance, the configuration having the C-plate between the polarizer 12 and the organic EL light emitting element 18 is most advantageous.

In other words, from the viewpoints of the thickness of the organic EL display device, the simplicity of the layer configuration between the polarizer 12 and the organic EL light emitting element 18, the cost, the productivity, and the like, as in the organic EL display device 10 shown in FIG. 1, the configuration in which only the phase difference layer 14 and the circularly polarized light separating layer 16 are provided between the polarizer 12 and the organic EL light emitting element 18 is most advantageous.

Any known C-plate can be used as the C-plate. In addition, a commercially available optical film may be used as the C-plate.

The arrangement position of the C-plate is preferably between the phase difference layer 14 and the circularly polarized light separating layer 16 or between the circularly polarized light separating layer 16 and the organic EL light emitting element 18. Rth(550) of the C-plate is not limited, but in order not to cause tinting due to a phase difference, it is preferable that the absolute value of Rth(550) of the C-plate is 300 nm or less.

Further, the C-plate may be used in combination of a plurality of the same C-plate or different C-plates as necessary.

[Organic EL Light Emitting Element]

The organic EL light emitting element 18 displays an image by organic EL.

As an example, the organic EL light emitting element 18 is a known organic EL light emitting element constituting an organic EL light emitting device (OLED), such as an organic EL display or an organic illumination device, having a transparent electrode layer (thin film transistor (TFT)), a hole injection layer, a hole transport layer, an organic EL light emitting layer, a hole blocking layer, an electron transport layer, an electron injection layer, a cathode, and the like.

In addition, as the organic EL light emitting element 18, one obtained by removing an antireflection layer (antireflection film) from a known organic EL display, an organic EL display not having an antireflection layer, a known organic EL display, or the like can be used.

(Effect of Improving Brightness of Blue Light)

In the organic EL display device 10 according to the embodiment of the present invention as described above, the effect of improving the brightness of blue light is obtained by the following action.

Figure 2:
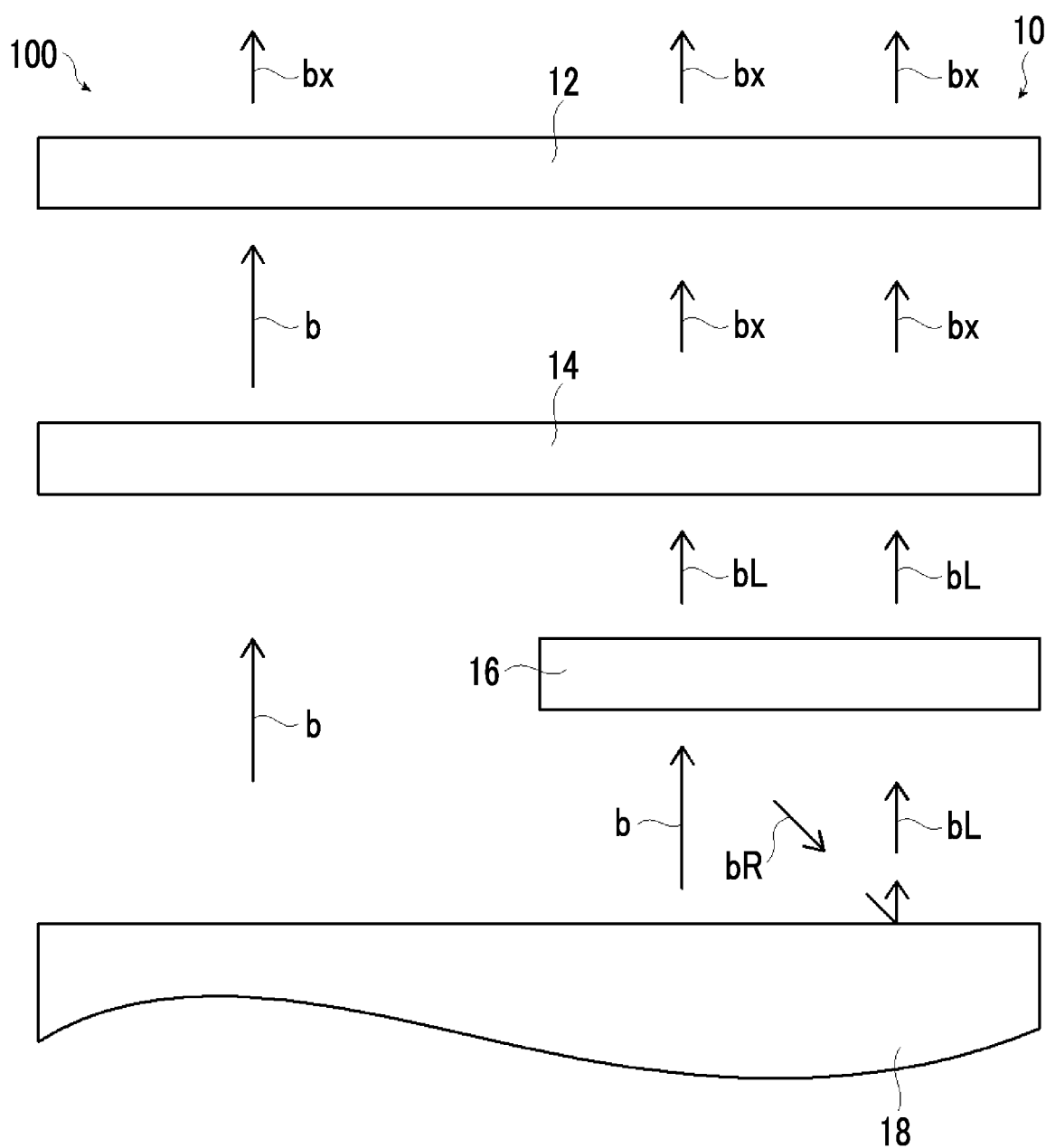
FIG. 2 is a conceptual view for describing the operation of the organic EL display device shown in FIG. 1.

FIG. 2 conceptually shows the organic EL display device 10 according to the embodiment of the present invention shown in FIG. 1 and an organic EL display device 100 of the related art in a disassembled state. As well known, the organic EL display device 100 of the related art also usually has a combination of the polarizer 12 and the phase difference layer 14 (λ/4 plate) as an antireflection film.

In the organic EL display device 100 of the related art, blue light b emitted by the organic EL light emitting element 18 is first made incident into the phase difference layer 14, is transmitted, and is then made incident into the polarizer 12. In FIG. 2, the length of the arrow of the blue light b represents light intensity (amount of light).

Since the polarizer 12 allows only transmission of linearly polarized light in a predetermined direction (referred to as the x direction), linearly polarized light in a direction orthogonal to the x direction is blocked by the polarizer 12.

Accordingly, the blue light b transmitted through the polarizer 12 is only half linearly polarized blue light bx in the x direction.

In contrast, in the organic EL display device 10 according to the embodiment of the present invention, first, the blue light b emitted by the organic EL light emitting element 18 is made incident into the circularly polarized light separating layer 16. As an example, in a case where the circularly polarized light separating layer 16 (cholesteric liquid crystal layer) is a layer which reflects only right circularly polarized blue light bR, left circularly polarized blue light bL is transmitted and right circularly polarized blue light bR is reflected.

The left circularly polarized blue light bL transmitted through the circularly polarized light separating layer 16 is then made incident into the phase difference layer 14 (λ/4 plate), is transmitted, and then is converted into linearly polarized blue light bx in the x direction.

Next, the linearly polarized blue light bx is made incident into the polarizer 12. As described above, the polarizer 12 allows transmission of only linearly polarized light in the x direction. Accordingly, the linearly polarized blue light bx which is linearly polarized light in the x direction is transmitted through the polarizer 12 and is emitted.

On the other hand, the right circularly polarized blue light bR reflected by the circularly polarized light separating layer 16 is incident and reflected by the organic EL light emitting element 18 (the substrate of the light emitting element), the turning direction of the circularly polarized light is reversed, and the right circularly polarized blue light is converted into left circularly polarized blue light bL.

Next, although the left circularly polarized blue light bL reflected by the organic EL light emitting element 18 is made incident into the circularly polarized light separating layer 16, as described above, only the right circularly polarized blue light bR is reflected and thus the left circularly polarized blue light bL is transmitted through the circularly polarized light separating layer 16.

After this, as described above, the left circularly polarized blue light bL is then converted by the phase difference layer 14 into linearly polarized blue light bx which is linearly polarized light in the x direction, is then transmitted through the polarizer 12, which allows transmission of only linearly polarized light in the x direction, and is emitted.

That is, in the organic EL display device 10 according to the embodiment of the present invention having the circularly polarized light separating layer 16, by adjusting the direction of the circularly polarized light reflected by the circularly polarized light separating layer 16, the slow axis of the phase difference layer 14, and the transmission axis of the polarizer 12 such that the direction of the linearly polarized light emitted by the phase difference layer 14 coincides with the direction of the transmission axis of the polarizer 12, the amount of blue light about two times that of the organic EL display device of the related art can be emitted.

Accordingly, since the brightness of blue light about two times that of the organic EL display device of the related art can be emitted according to the organic EL display device 10 according to the embodiment of the present invention, an image display having high brightness can be obtained by improving the brightness of red light and green light together with blue light. In contrast, in a case where the display brightness may be the same as the display brightness of the organic EL display device of the related art, since the output of a blue light emitting source (organic EL light source for emitting blue light) can be reduced, the service life of the blue light emitting source can be extended and an organic EL display device 10 having high durability can be realized.

Such an effect is obtained similarly even in a case where the circularly polarized light separating layer 16 has a selective reflection center wavelength in the wavelength range of red light or in a case where the circularly polarized light separating layer 16 has a selective reflection center wavelength in the wavelength range of green light according to the color of the corresponding light.

EXAMPLES

Hereinafter, the present invention will be described in more detail with reference to Examples. However, the present invention is not limited thereto.

(Preparation of Temporary Support)

A triacetyl cellulose film (TAC film) having a thickness of 60 μm manufactured by Fujifilm Corporation was prepared.

On the other hand, the following alignment film coating liquid was prepared, dissolved by heating at 85° C. for 1 hour with stirring, and filtered with a 0.45 μm filter.

| Alignment film coating liquid | |
|---|---|
| PVA203 (polyvinyl alcohol manufactured by Kuraray Co., Ltd.) | 2.4 parts by mass |
| Pure water | 97.6 parts by mass |

The prepared alignment film coating liquid was applied onto the TAC film while adjusting the coating amount so that the film thickness after drying was 0.5 μm, and dried at 100° C. for 2 minutes.

The dried coating film was subjected to a rubbing treatment to prepare a film-like temporary support. The direction of the rubbing treatment was set to be parallel to the longitudinal direction of the film.

As a temporary support, in addition to the TAC film, it was confirmed that a normal polyethylene terephthalate film (PET film, for example, COSMOSHINE A4100, manufactured by Toyobo Co., Ltd.) could be used.

(Preparation of Coating Liquid A for Blue Light Reflection Circularly Polarized Light Separating Layer)

A coating liquid A for a circularly polarized light separating layer having the following composition was prepared, dissolved by heating at 25° C. for 1 hour, and filtered with a 0.45 μm filter. The following disk-like liquid crystal compound is a liquid crystal compound having an average refractive index n=1.678 and a birefringence Δn=0.156.

| Coating liquid A for circularly polarized light separating layer | |
|---|---|
| Disk-like liquid crystal compound (Compound 101) | 80 parts by mass |
| Disk-like liquid crystal compound (Compound 102) | 20 parts by mass |
| Additive 1 | 1.8 parts by mass |
| Additive | 0.16 parts by weight |
| Additive 3 (F444, manufactured by DIC Corporation) | 0.5 parts by weight |
| Photopolymerization initiator 1 | 3 parts by mass |
| Chiral agent 1 | 5.18 parts by mass |
| Methyl ethyl ketone | 400 parts by mass |
| Cyclohexanone | 50 parts by mass |

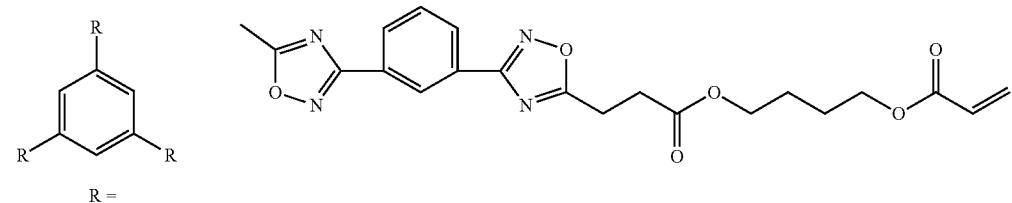

Compound 101

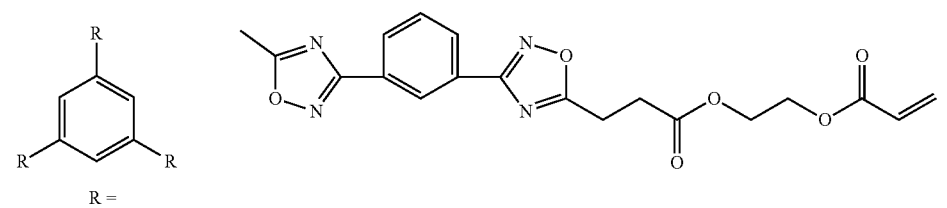

Compound 102

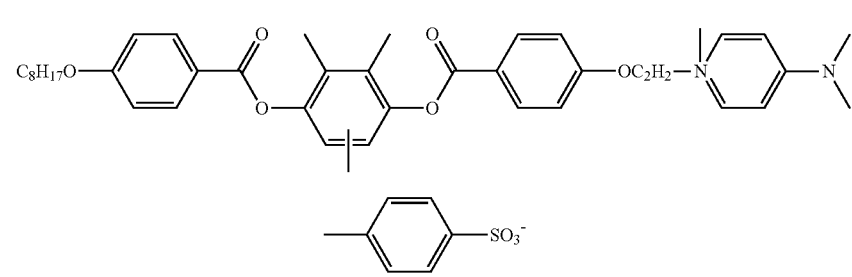

Additive 1

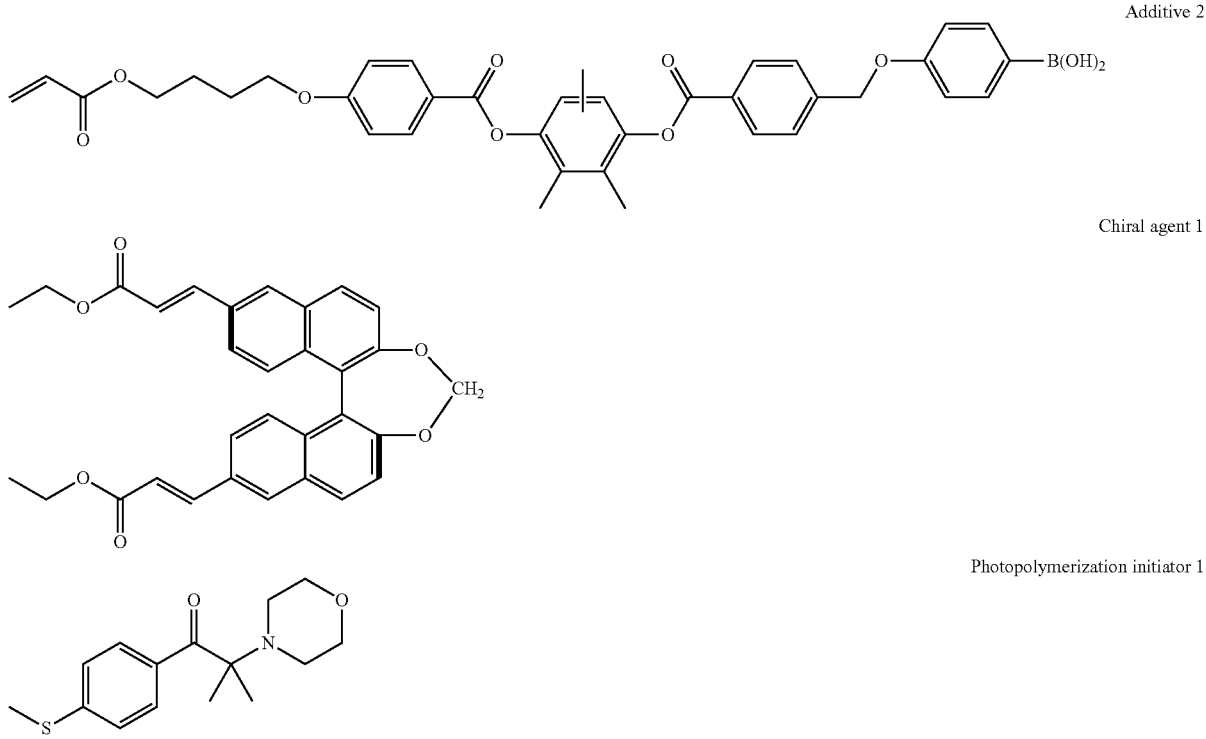

(Preparation of Circularly Polarized Light Separating Layer A)

The prepared coating liquid A for a circularly polarized light separating layer was applied to the rubbed surface of the temporary support using a Giesser (coating width: 1200 mm).

Subsequently, after the coating film was dried at 100° C. for 2 minutes and the solvent was evaporated, heat aging was performed at 115° C. for 3 minutes to obtain a homogeneously aligned state. Thereafter, the coating film was retained at 45° C. and was subjected to ultraviolet irradiation (300 mJ/cm$^2$) under a nitrogen atmosphere by using a high pressure mercury lamp to form a circularly polarized light separating layer (cholesteric liquid crystal layer) A reflecting right circularly polarized blue light.

The formed circularly polarized light separating layer A was cut into slits at an interval of a coating width of 10 mm. In the slits, samples having a substantially uniform thickness (within ±5 nm) was obtained.

The central slit was selected among the slits, and the cross section of the circularly polarized light separating layer A was observed by SEM. As a result, the film thickness was 1.08 μm, and the number of spiral turns was 4.0 pitches. That is, the period of one pitch is 0.27 μm.

A glass substrate having a pressure sensitive adhesive layer formed on one surface was prepared.

The prepared circularly polarized light separating layer A side was bonded to the pressure sensitive adhesive layer side of this glass substrate, and the temporary support was peeled off.

As a result of measuring the phase difference of the circularly polarized light separating layer A with AxoScan, it was found that Re(550)/Rth(550)=0.6 nm/−53 nm. In addition, the wavelength (selective reflection center wavelength) at which the transmittance for light in the normal direction is minimum was 453 nm, and the transmittance thereof was 35%. In a case where the period of one pitch was calculated from (selective reflection center wavelength)/ (average refractive index), the period was 0.27 μm, which was confirmed to be consistent with the SEM observation described above.

Thus, it was confirmed that the circularly polarized light separating layer A reflected blue light and functioned as a +C-plate outside the selective reflection range.

(Preparation of Coating Liquid B for Blue Light Reflecting Circularly Polarized Light Separating Layer)

A coating liquid B for a circularly polarized light separating layer having the following composition was prepared. The following rod-like liquid crystal compound is a liquid crystal compound having an average refractive index n=1.678 and a birefringence Δn=0.160.

| Coating Liquid B for Circularly Polarized Light Separating Layer | |
|---|---|
| Mixture of rod-like liquid crystal compounds below | 100.0 parts by mass |
| Photopolymerization initiator 1 | 3.0 parts by mass |
| Chiral agent 2 | 6.6 parts by mass |
| Additive 4 | 0.095 parts by mass |
| Additive 3 (F444, manufactured by DIC Corporation) | 0.5 parts by weight |
| Methyl ethyl ketone | 400 parts by mass |
| Cyclohexanone | 50 parts by mass |

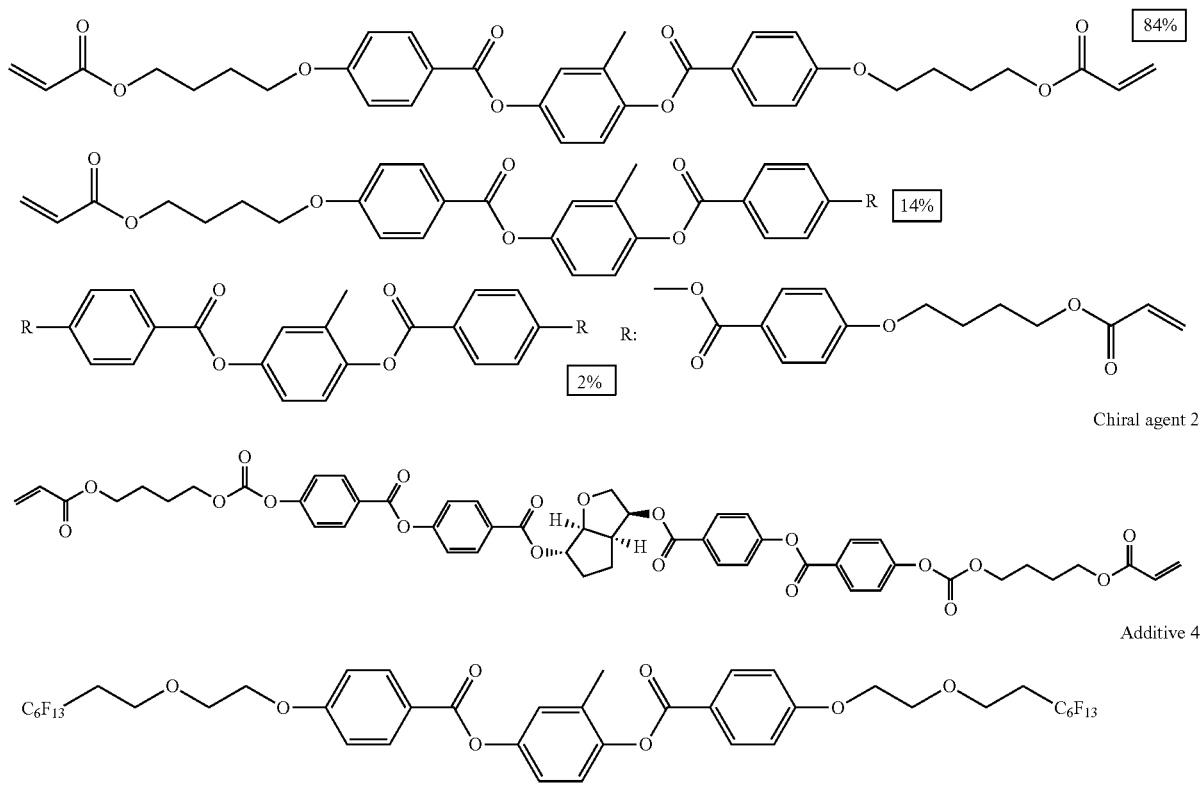

(Preparation of Circularly polarized Light Separating Layer B)

The prepared coating liquid B for a circularly polarized light separating layer was applied to the rubbed surface of the temporary support using a Giesser (coating width: 1200 mm). Subsequently, after the coating film was dried at 95° C. for 1 minute, the coating film was subjected to ultraviolet irradiation (500 mJ/cm$^2$) at 25° C. by using a high pressure mercury lamp to form a circularly polarized light separating layer (cholesteric liquid crystal layer) B reflecting right circularly polarized blue light.

The formed circularly polarized light separating layer B was cut into slits at an interval of a coating width of 10 mm. Although there was a thickness difference between the slits, samples having a substantially uniform thickness (within ±5 nm) were obtained in the slits.

The central slit was selected among the slits, and the cross section of the circularly polarized light separating layer B was observed by SEM. As a result, the film thickness was 1.09 nm, and the number of spiral turns was 4 pitches. That is, one pitch is 0.27 μm.

A glass substrate having a pressure sensitive adhesive layer formed on one surface was prepared.

The formed circularly polarized light separating layer B side was bonded to the pressure sensitive adhesive layer side of this glass substrate, and the temporary support was peeled off. As a result of measuring the phase difference of the circularly polarized light separating layer B with AxoScan, it was found that Re(550)/Rth(550)=0.7 nm/77 nm. In addition, the wavelength (selective reflection center wavelength) at which the transmittance for light in the normal direction is minimum was 454 nm, and the transmittance thereof was 35%. In a case where the period of one pitch was calculated from (selective reflection center wavelength)/(average refractive index), the period was 0.27 μm, which was confirmed to be consistent with the SEM observation described above.

Thus, it was confirmed that the circularly polarized light separating layer B reflected blue light and functioned as a –C-plate outside the selective reflection range.

(Preparation of Phase Difference Layer)

A coating liquid for a phase difference layer having the following composition was prepared.

| Coating liquid for phase difference layer | |
|---|---|
| Liquid crystal compound L-3 below | 43.75 parts by mass |
| Liquid crystal compound L-4 below | 43.75 parts by mass |
| Polymerizable compound A-1 below | 12.50 parts by mass |
| Polymerization initiator S-1 (oxime type) below | 3.00 parts by mass |
| Leveling agent G-1 | 0.20 parts by mass |
| HISOLVE MTEM (manufactured by Toho Chemical Industry Co., Ltd.) | 2.00 parts by mass |
| NK ESTER A-200 (manufactured by Shin-Nakamura Chemical Co., Ltd.) | 1.00 part by mass |
| Methyl ethyl ketone | 424.8 parts by mass |

The group adjacent to the acryloyloxy group in the following liquid crystal compounds L-3 and L-4 represents a propylene group (a group in which a methyl group is substituted with an ethylene group), and the following liquid crystal compounds L-3 and L-4 each represent a mixture of positional isomers in which methyl group positions are different.

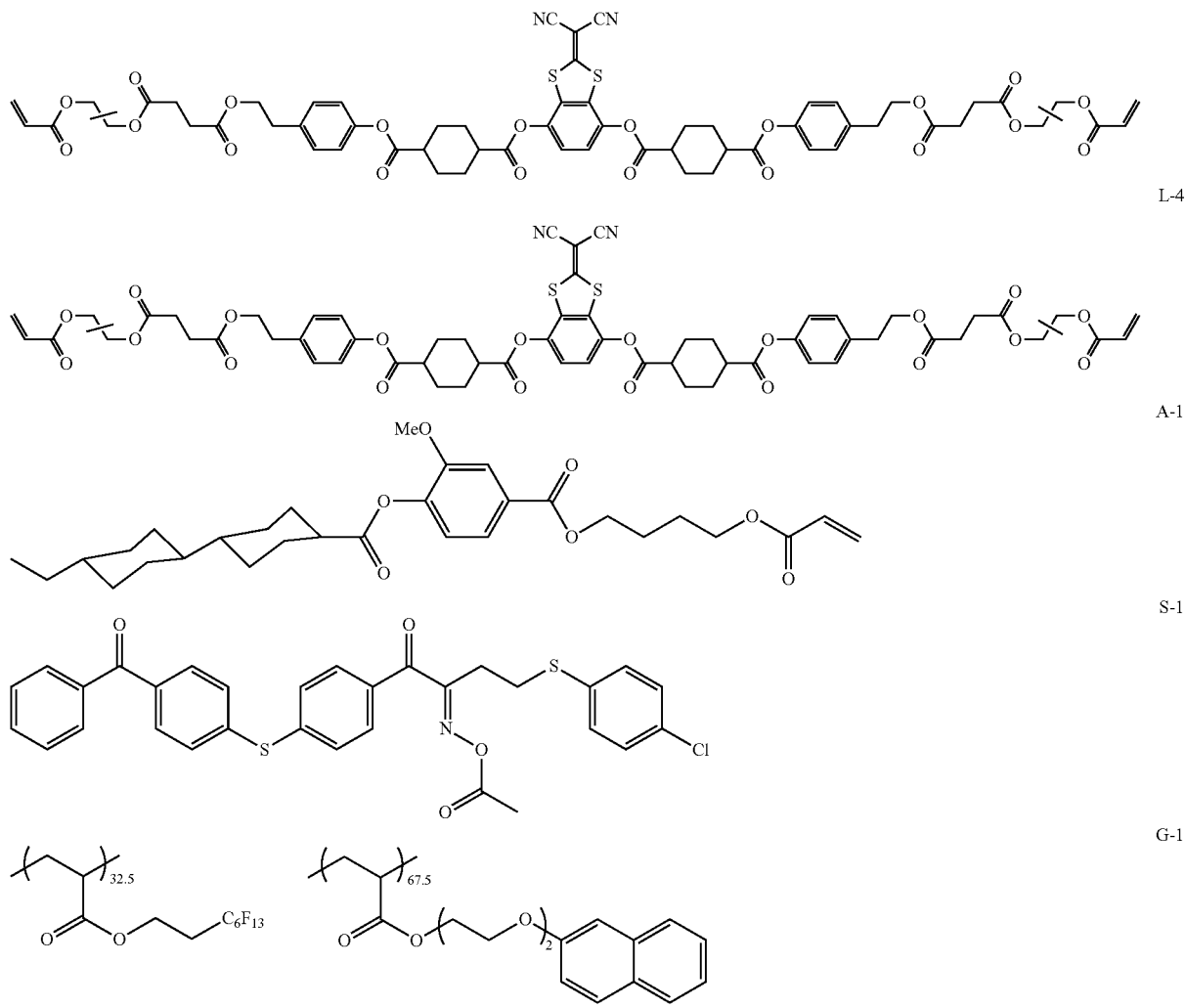

As a temporary support, a PET film (manufactured by FUJIFILM Corporation, thickness: 75 μm) having one surface subjected to a rubbing treatment was prepared. The rubbing direction was 45° with respect to the longitudinal direction of the PET film.

The prepared coating liquid for a phase difference layer was applied to the rubbed surface of the temporary support. Subsequently, after the coating film was dried at 90° C. for 2 minutes and the solvent was evaporated, heat aging was performed at 60° C. for 3 minutes to obtain a homogeneously aligned state. Then, the coating film was retained at 60° C. and was subjected to ultraviolet irradiation (500 mJ/cm$^2$) under a nitrogen atmosphere by using a high pressure mercury lamp to form a phase difference layer (optically anisotropic layer) having a film thickness of 2.0 mm.

A glass substrate having a pressure sensitive adhesive layer formed on one surface was prepared.

The formed phase difference layer was bonded to the pressure sensitive adhesive layer side of this glass substrate, and the temporary support was peeled off. As a resulting of measuring the phase difference of the phase difference layer with AxoScan, the following values were obtained. The measurement wavelengths used were 450 nm, 550 nm, and 650 nm.

TABLE 1

|  | 450 nm | 550 nm | 650 nm |
|---|---|---|---|
| Re/Rth(nm) | 119/60 | 140/70 | 147/74 |

The above table shows that Re and Rth at a wavelength of 450 nm were respectively 119 nm and 60 nm, Re and Rth at a wavelength of 550 nm were respectively 140 nm and 70 nm, and Re and Rth at a wavelength of 650 nm were respectively 147 nm and 74 nm.

Thus, it was confirmed that the phase difference layer was a λ/4 film of a +A-plate having reciprocal wavelength dispersibility. Hereinafter, the phase difference layer is also referred to as a λ/4 film.

(Preparation of Polarizer)

A TAC film (FUJITACK TD80UL, manufactured by Fujifilm Corporation) was immersed in a 1.5 N aqueous sodium hydroxide solution at 55° C. for 2 minutes, was washed in a water bath at room temperature, and was neutralized using 0.1 N sulfuric acid at 30° C. The neutralized TAC film was washed in a water-washing bath at room temperature again and further dried with hot air of 100° C.

On the other hand, a roll was prepared by winding a polyvinyl alcohol film (PVA film) having a thickness of 80 µm. The PVA film was pulled out from the roll, continuously stretched 5 times in the longitudinal direction in an aqueous iodine solution, and dried to obtain a polarizer having a thickness of 20 µm.

The TAC film was bonded to only one side of the polarizer using a 3% aqueous solution of polyvinyl alcohol (PVA-117H, manufactured by Kuraray Co., Ltd.) as a pressure sensitive adhesive to prepare one side polarizer. The degree of polarization was 99.97% and the single plate transmittance was 43%.

Here, the degree of polarization and the single plate transmittance were measured using a spectrophotometer (VAP-7070, manufactured by JASCO Corporation).

(Production of Laminate Film)

A λ/4 film was laminated on the polarizer side of the one side polarizer such that the angle of the slow axis with respect to the transmission axis of the polarizer was 45°±10°.

Further, on the side where the λ/4 film was laminated, the circularly polarized light separating layer A was laminated such that the surface of the circularly polarized light separating layer A and the λ/4 film faced each other, and after lamination, the temporary support of the λ/4 film was peeled off to produce a laminate film. At this time, the angle formed between the rubbing direction of the alignment film in a case where the circularly polarized light separating layer A was formed and the slow axis of the λ/4 film was 45°±10°.

Similarly, a laminate film was produced for the circularly polarized light separating layer B.

In addition, each layer was bonded using a pressure sensitive adhesive (SK2057, manufactured by Soken Chemical Co., Ltd.). Regarding this point, the same applies to the following laminate films. This pressure sensitive adhesive is a substance having no refractive index anisotropy, and thus Rth is 0 nm.

(Preparation of Organic EL Display Device)

Galaxy S4 (manufactured by Samsung Electronics Co., Ltd.) was disassembled, the antireflection film laminated on the product was partially peeled off and the device was used as an organic EL light emitting element. This organic EL light emitting element was bonded to the produced laminate film using a pressure sensitive adhesive (SK2057, manufactured by Soken Chemical Co., Ltd.) to produce an organic EL display device. At this time, the laminate film was bonded such that the circularly polarized light separating layer side was the organic EL light emitting element side.

Analysis of Tint Change when Turned Off
(Preparation Example 1)

With respect to the organic EL display device, a change in tint caused by the circularly polarized light separating layer (cholesteric liquid crystal layer) in a case where the display device was viewed from the front when turned off was confirmed and analyzed as follows.

Various circularly polarized light separating layers having different film thicknesses were formed in the same manner as the circularly polarized light separating layer A. Next, various laminate films were prepared in the same manner as the above-described laminate films using each of the formed circularly polarized light separating layers. Further, various organic EL display devices were prepared using the prepared laminate films in the same manner as in the preparation of the organic EL display device described above.

Regarding the prepared organic EL display device, the tint a* in a case where the display device was from the front when turned off was measured, and as shown in FIG. 3, the relationship between the film thickness of the circularly polarized light separating layer and the tint a* was graphed.

In addition, regarding the circularly polarized light separating layer B, similarly, various circularly polarized light separating layers having different film thicknesses were formed, similarly, a laminate film was prepared, and an organic EL display device was prepared. The relationship between the film thickness of the circularly polarized light separating layer and the tint a* was detected and was also shown in the graph of FIG. 3.

In FIG. 3, a black circle (separating layer A) represents an organic EL display device using a circularly polarized light separating layer formed of a disk-like liquid crystal compound and corresponding to the circularly polarized light separating layer A, and a white circle (separating layer B) represents an organic EL display device using a circularly polarized light separating layer formed of a rod-like liquid crystal compound and corresponding to the circularly polarized light separating layer B.

The tint was measured using a spectrophotometer (CM-2022, manufactured by Konica Minolta Inc.) under the conditions of D65, a viewing angle of 10°, and SCI.

As shown in FIG. 3, it was confirmed that a change in tint when viewed from the front occurred according to a change in the film thickness of the circularly polarized light separating layer and periodically changed according to the film thickness, which is the subject of the present invention, and this period substantially matched with 0.135 µm, which is half of the spiral pitch of the circularly polarized light separating layer.

Thus, it can be presumed as follows: every time the spiral pitch of the circularly polarized light separating layer is rotated by 180°, the optical anisotropy in the plane caused by the liquid crystal compound molecules is canceled and Re becomes zero; however, the in-plane optical anisotropy cannot be completely canceled when the rotation of the liquid crystal compound molecules is less than 180°, Re is thus generated, and Re generated in the circularly polarized light separating layer affects the optical performance combined with the antireflection layer including the polarizer and the phase difference layer to cause a change in the tint.

In addition, Re(550) of each circularly polarized light separating layer used in the organic EL display device was measured by AxoScan, and as shown in FIG. 4, the relationship between the film thickness of the circularly polarized light separating layer and Re(550) was graphed. As a result, it could be confirmed that Re(550) of the circularly polarized light separating layer periodically changed according to the film thickness of the circularly polarized light separating layer, and the periodic change coincided with the change in tint with respect to the film thickness. Further, in this example, it was found that the change of Re(550) is about 9 nm at most.

In FIG. 4, a black circle (separating layer A) represents a circularly polarized light separating layer formed of a disk-like liquid crystal compound and corresponding to the circularly polarized light separating layer A, and a white circle (separating layer B) represents a circularly polarized light separating layer formed of a rod-like liquid crystal compound and corresponding to the circularly polarized light separating layer B.

As described above, due to the change in the film thickness, Re(550) of the circularly polarized light separating layer was periodically changed according to the film thickness, and the relationship corresponding to a change in tint when the organic EL display device was viewed from the front at the time of turn-off was quantitatively grasped. Based on the above knowledge, even in a case where there is a certain degree of thickness distribution, it is possible to predict where a region having a desired Re(550) exists, and a sample having the desired Re(550) can be obtained relatively easily as before.

Further, as shown in FIGS. 4 and 5, in the region in which Re(550) of the circularly polarized light separating layer is less than 0.5, the ratio of a variation in Re(550) to a change in film thickness is very large, Re(550) significantly varies even with a fine film thickness unevenness, and fine color unevenness occurs. In contrast, in the region in which Re(550) of the circularly polarized light separating layer is 0.5 or more, a variation in Re(550) with respect to a change in film thickness becomes gentle. Therefore, in the region in which Re(550) of the circularly polarized light separating layer is 0.5 or more, Re(550) is not largely varied by a minute change in film thickness. That is, as shown in FIGS. 4 and 5, by setting Re(550) of the circularly polarized light separating layer to 0.5 or more, a variation of Re(550) due to a change in film thickness is suppressed, and the generation of fine color unevenness can be suppressed.

It was considered that a macro change in Re(550) in the circularly polarized light separating layer is correlated with the direction of the director of the liquid crystal compound on the outermost surface of the circularly polarized light separating layer, and the direction of the director of the liquid crystal compound was measured by sum frequency generation spectroscopy (SFG) by selecting 9 points at equal intervals from a 40 mm×40 mm sample (Re(550) 7.1 nm, axis angle 64°) with uniform tint. However, unlike the expectation, the direction of the director of the liquid crystal compound was various (0°, 38°, 28°, 40°, 32°, 22°, 39°, 25° and 40° with respect to the rubbing direction), and at least no microscopic director direction agreement was found.

Preparation Examples 2 to 26

As in the case of the circularly polarized light separating layer A, 5 circularly polarized light separating layer samples A1 to A5 having different film thicknesses, that is, Re(550) around a film thickness of 1.1 μm were prepared. As in the case of the circularly polarized light separating layer B, 3 circularly polarized light separating layer samples B1 to B3 having different film thicknesses, that is, Re(550) around the film thickness of 1.1 μm were prepared. However, only in sample A5 (Preparation Example 26), the content of chiral agent 1 was changed from 5.18 parts by mass to 3.03 parts by mass in the coating liquid A for a circularly polarized light separating layer used for forming the circularly polarized light separating layer A. Except for this, the circularly polarized light separating layer of sample A5 is basically the same as sample A1 except for the film thickness.

That is, the circularly polarized light separating layers of samples A1 to A5 are circularly polarized light separating layers formed of a disk-like liquid crystal compound (DLC), and the circularly polarized light separating layers of samples B1 to B3 are circularly polarized light separating layers formed of a rod-like liquid crystal compound (CLC).

For each sample, the film thickness, Re(550), the direction of the slow axis (in-plane slow axis), and the selective reflection center wavelength of the circularly polarized light separating layer were measured. The film thickness, Re(550), and the selective reflection center wavelength of the circularly polarized light separating layer were measured as described above. In addition, the direction of the slow axis was measured by AxoScan.

Using these circularly polarized light separating layers, laminate films were prepared in the same manner as in the above example. As the laminate films, laminate films were prepared in which the angle θ formed between the slow axis of the λ/4 film (phase difference layer) and the slow axis of the circularly polarized light separating layer was changed. In a case where the laminate film in which the polarizer, the phase difference layer and the circularly polarized light separating layer were laminated was viewed from the circularly polarized light separating layer side, the angle θ had a positive value clockwise with respect to the slow axis of the λ/4 film.

An organic EL display device was prepared as described above using the prepared laminate film.

In addition, only in Preparation Example 25, a +C-plate (positive C-plate) was laminated between the circularly polarized light separating layer and the organic EL element. The +C-plate was bonded using (SK pressure sensitive adhesive, manufactured by Soken Chemical Co., Ltd.). Preparation Example 25 is the same as Preparation Example 20 except that the +C-plate is provided.

The +C-plate was prepared as follows.

(Preparation of +C-Plate)

A temporary support having a PVA alignment film was prepared, and the PVA alignment film was subjected to a rubbing treatment. Thereafter, a coating liquid for a C-plate having the following composition was applied. The temporary support (including the alignment film) was peeled off when the above-described +C-plate was laminated.

After application, the coating was dried at 60° C. for 60 seconds and then irradiated with ultraviolet rays of 1000 mJ/cm$^2$ (i-line) in air using an air-cooled metal halide lamp (manufactured by Eye Graphic Co., Ltd.) at 70 mW/cm$^2$ (i-line) to fix the alignment state, and the polymerizable rod-like liquid crystal compound was vertically aligned to prepare a +C-plate.

Rth(550) of the prepared +C-plate was −115 nm. Rth(550) of the +C-plate was measured in the same manner as above.

| Coating liquid for C-plate | |
| --- | --- |
| Rod-like liquid crystal compound C1 | 80 parts by mass |
| Rod-like liquid crystal compound C2 | 20 parts by mass |
| Vertical alignment agent (S01) | 1 part by mass |
| Vertical alignment agent (S02) | 0.5 parts by mass |
| Ethylene oxide modified trimethylolpropane triacrylate (V#360, manufactured by Osaka Organic Chemical Industry Ltd.) | 8 parts by mass |
| IRGACURE 907 (manufactured by BASF SE) | 3 parts by mass |
| Kayacure DETX (manufactured by Nippon Kayaku Co., Ltd.) | 1 part by mass |
| Compound B01 | 0.4 parts by mass |
| Methyl ethyl ketone | 170 parts by mass |
| Cyclohexanone | 30 parts by mass |

Rod-like liquid crystal compound C1
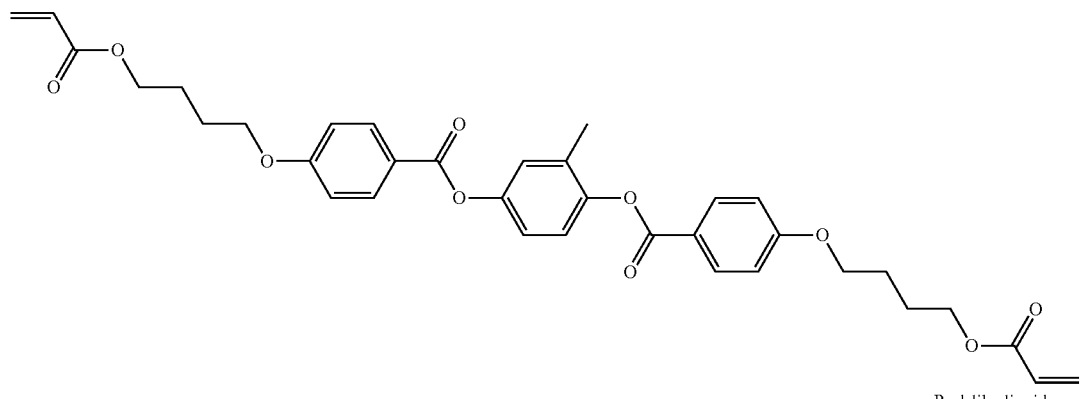
Rod-like liquid crystal compound C2
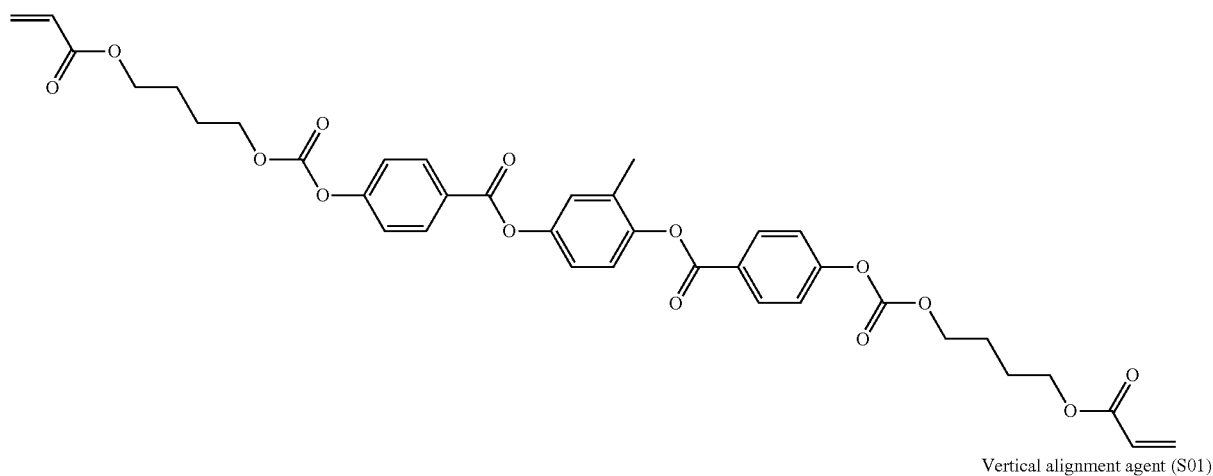
Vertical alignment agent (S01)
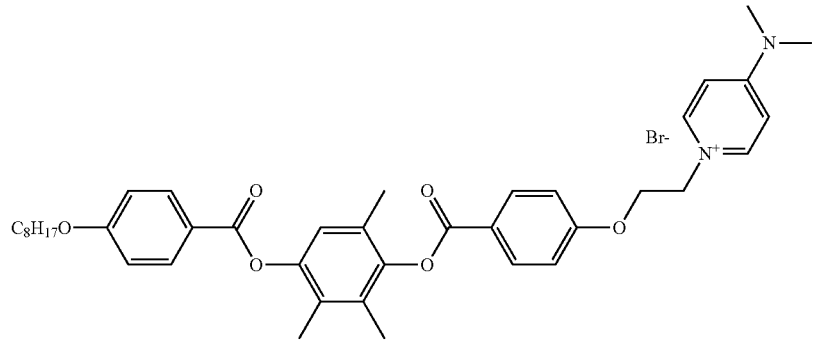
Vertical alignment agent (S02)
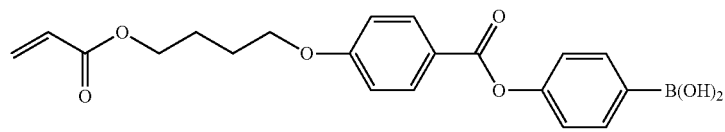
Compound B01
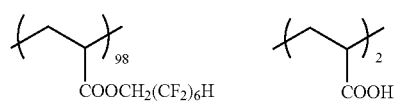

Regarding each of the prepared organic EL display devices, the reflection tint and the brightness improvement rate in a case where the display device was observed from the front when the display device was turned off were evaluated.

(Evaluation of Reflection Tint)

In a state where the organic EL display device was turned off, the measurement was performed using a spectrophotometer (CM-2022, manufactured by Konica Minolta Inc.) under the conditions of D65, a viewing angle of 10°, and SCI. The measurement was performed from the front direction (normal direction (polar angle 0°)). With respect to Preparation Examples 3, 7, 16, 20 and 25, the reflection tint from not only the front side but also an oblique direction (direction of a polar angle of 60°) was evaluated.

The evaluation standards are as follows.
AA: The tint is black and is the best.
A: The tint is black and particularly excellent.
B: The tint is close to black and excellent.
C+: The tint is slightly shifted from black but is allowable.
C−: The tint is not allowable since the tint is more slightly shifted from black.
D: The tint is clearly shifted from black and is not allowable.

(Brightness Improvement Rate)

For the evaluation of the brightness improvement rate, the maximum light amount in a wavelength range of 430 to 480 nm when the organic EL display device displayed blue was measured in the normal direction of the organic EL display device (blue light amount). In addition, the maximum light amount in a wavelength range of 700 to 800 nm when the organic EL display device displayed red was measured in the normal direction of the organic EL display device (red light amount).

The evaluation was performed with a relative value when the maximum light amount of Galaxy S4 as a product was 100%.

The details of the layer configuration and the evaluation results are shown in the following tables.

TABLE 2

| | Circularly polarized light separating layer | | | | | | Evaluation result | | | | |
| | | | | | | | Reflection tint | | Brightness improvement rate [%] | | |
| Sample | Sample name | Selective reflection center wavelength [nm] | Re (550 nm) [nm] | Film thickness [μm] | Angle θ [°] | C-pate | Total Rth [nm] | Front | Oblique | Blue light amount | Red light amount | Properties |
|---|---|---|---|---|---|---|---|---|---|---|---|---|
| Preparation Example 2 | A1(DLC) | 453 | 0.6 | 1.084 | −45 | Not provided | 20 | A | | 118 | 100 | Invention Example |
| Preparation Example 3 | A1(DLC) | 453 | 0.6 | 1.084 | 10 | Not provided | 20 | AA | A | 117 | 100 | Invention Example |
| Preparation Example 4 | A1(DLC) | 453 | 0.6 | 1.084 | 45 | Not provided | 20 | A | | 118 | 100 | Invention Example |
| Preparation Example 5 | A1(DLC) | 453 | 0.6 | 1.084 | 90 | Not provided | 20 | B | | 117 | 100 | Invention Example |
| Preparation Example 6 | A2(DLC) | 452 | 3.0 | 1.097 | −45 | Not provided | 19 | B | | 118 | 100 | Invention Example |
| Preparation Example 7 | A2(DLC) | 452 | 3.0 | 1.097 | 10 | Not provided | 19 | A | A | 118 | 100 | Invention Example |
| Preparation Example 8 | A2(DLC) | 452 | 3.0 | 1.097 | 45 | Not provided | 19 | B | | 117 | 100 | Invention Example |
| Preparation Example 9 | A2(DLC) | 452 | 3.0 | 1.097 | 90 | Not provided | 19 | C+ | | 118 | 100 | Invention Example |
| Preparation Example 10 | A3(DLC) | 454 | 5.8 | 1.115 | −45 | Not provided | 18 | C− | | 119 | 100 | Comparative Example |
| Preparation Example 11 | A3(DLC) | 454 | 5.8 | 1.12 | 10 | Not provided | 18 | B | | 117 | 100 | Invention Example |
| Preparation Example 12 | A3(DLC) | 454 | 5.8 | 1.115 | 45 | Not provided | 18 | C− | | 118 | 100 | Comparative Example |
| Preparation Example 13 | A3(DLC) | 454 | 5.8 | 1,115 | 90 | Not provided | 18 | D | | 117 | 100 | Comparative Example |
| Preparation Example 14 | A4(DLC) | 453 | 9.0 | 1.150 | −45 | Not provided | 16 | D | | 118 | 100 | Comparative Example |
| Preparation Example 15 | A4(DLC) | 453 | 9.0 | 1.15 | −30 | Not provided | 16 | C+ | | 117 | 100 | Invention Example |
| Preparation Example 16 | A4(DLC) | 453 | 9.0 | 1.15 | 10 | Not provided | 16 | B | B | 118 | 100 | Invention Example |
| Preparation Example 17 | A4(DLC) | 453 | 9.0 | 1.15 | 30 | Not provided | 16 | C+ | | 118 | 100 | Invention Example |
| Preparation Example 18 | A4(DLC) | 453 | 9.0 | 1.150 | 45 | Not provided | 16 | D | | 119 | 100 | Comparative Example |
| Preparation Example 19 | A4(DLC) | 453 | 9.0 | 1.150 | 90 | Not provided | 16 | D | | 118 | 100 | Comparative Example |
| Preparation Example 20 | B1(CLC) | 454 | 0.7 | 1.085 | 10 | Not provided | 134 | AA | C+ | 117 | 100 | Invention Example |
| Preparation Example 21 | B1(CLC) | 454 | 0.7 | 1.085 | 90 | Not provided | 134 | B | | 117 | 100 | Invention Example |
| Preparation Example 22 | B2(CLC) | 455 | 2.9 | 1.096 | 90 | Not provided | 134 | C+ | | 117 | 100 | Invention Example |

TABLE 2-continued

| | Circularly polarized light separating layer | | | | | | Evaluation result | | | | |
| | | | | | | | | | Brightness improvement rate [%] | | |
| | Sample name | Selective reflection center wavelength [nm] | Re (550 nm) [nm] | Film thickness [μm] | Angle θ [°] | C-pate | Total Rth [nm] | Reflection tint | | Blue light amount | Red light amount | Properties |
| | | | | | | | | Front | Oblique | | | |
|---|---|---|---|---|---|---|---|---|---|---|---|---|
| Preparation Example 23 | B3(CLC) | 454 | 9.2 | 1.14 | 30 | Not provided | 136 | C+ | | 118 | 100 | Invention Example |
| Preparation Example 24 | B3(CLC) | 454 | 9.2 | 1.150 | 90 | Not provided | 136 | D | | 118 | 100 | Comparative Example |
| Preparation Example 25 | B1(CLC) | 454 | 0.7 | 1.085 | 10 | Provided | 19 | AA | A | 118 | 100 | Invention Example |
| Preparation Example 26 | A5(DLC) | 750 | 0.6 | 1.084 | 10 | Not provided | 20 | AA | | 100 | 117 | Invention Example |

The λ/4 film (phase difference layer) of the laminate film exhibits reciprocal dispersibility and Rth(550) is 70 nm.

The angle θ is an angle which is formed between the slow axis of the λ/4 film and the slow axis of the circularly polarized light separating layer and has a positive value clockwise with respect to the slow axis of the λ/4 film.

Further, the total Rth is a total value of values of Rth(550) of members between the polarizer and the organic EL light emitting element.

As shown in the above tables, it could be confirmed that by using the optical laminate film of the first embodiment of the present invention in which the range of Re(550) of the circularly polarized light separating layer is 0.5 to 3.0 nm, and the optical laminate film of the second embodiment of the present invention in which the angle formed between the slow axis of the λ/4 film and the slow axis of the circularly polarized light separating layer is −30° to 30°, the reflection tint from the front in the organic EL display device when turned off was good. This effect was similarly confirmed for both the rod-like liquid crystal compound (CLC) and the disk-like liquid crystal compound (DLC).

Further, as shown in Preparation Examples 3, 7, 20, 25, and 26, in the optical laminate film of the present invention, since Re(550) of the circularly polarized light separating layer satisfied the condition of the first embodiment of the present invention and the angle formed between the slow axis of the λ/4 film and the slow axis of the circularly polarized light separating layer satisfied the condition of the second embodiment of the present invention, the tint can be further improved, and a good result that the tint is closest to black was obtained.

In addition, Preparation Examples 20 and 25 have the same configuration except that a C-plate is not provided, but as shown in Preparation Example 25, by adjusting Rth between the polarizer and the organic EL light emitting element by inserting a C-plate, the reflection tint in a case of observation in the oblique direction can be improved.

Further, as shown in Preparation Example 26, by setting the selective reflection center wavelength of the circularly polarized light separating layer to 700 to 800 nm, the reflection tint is good and the brightness of red light (around 700 to 800 nm) is improved.

From the above results, the effect of the present invention is clear.

INDUSTRIAL APPLICABILITY

The present invention can be used for various applications as a display device.

EXPLANATION OF REFERENCES

10: organic EL display device
12: polarizer
14: phase difference layer
16: circularly polarized light separating layer
18: organic EL light emitting element
b: blue light
bx: linearly polarized blue light
bL: left circularly polarized blue light
bR: right circularly polarized blue light

What is claimed is:

1. An optical laminate film comprising, at least:
a polarizer;
a phase difference layer; and
a circularly polarized light separating layer,
wherein the polarizer, the phase difference layer, and the circularly polarized light separating layer are arranged in this order,
an in-plane retardation Re(550) of the phase difference layer is 120 to 160 nm,
the polarizer and the phase difference layer are arranged such that an angle formed between a transmission axis of the polarizer and a slow axis of the phase difference layer is 45°±10°,
the circularly polarized light separating layer is a cholesteric liquid crystal layer formed by fixing a cholesteric liquid crystalline phase, and an in-plane retardation Re(550) of the cholesteric liquid crystal layer is 0.5 to 3.0 nm.

2. The optical laminate film according to claim 1, wherein the circularly polarized light separating layer is formed of a disk-like liquid crystal compound.

3. The optical laminate film according to claim 1, wherein a selective reflection center wavelength of the circularly polarized light separating layer is in a range of 430 to 480 nm.

4. The optical laminate film according to claim 1, wherein a selective reflection center wavelength of the circularly polarized light separating layer is in a range of 700 to 800 nm.

5. The optical laminate film according to claim 1, wherein the phase difference layer exhibits reciprocal wavelength dispersibility.

6. The optical laminate film according to claim 1, wherein the number of spiral turns of the circularly polarized light separating layer is 1.5 to 6.5.

7. An organic electroluminescent display device comprising:
the optical laminate film according to claim 1; and
an organic electroluminescent light emitting element,
wherein the optical laminate film and the organic electroluminescent light emitting element are arranged so as to sandwich the circularly polarized light separating layer between the phase difference layer and the organic electroluminescent light emitting element.

8. The organic electroluminescent display device according to claim 7, wherein a total of retardations Rth(550) in a thickness direction of members arranged between the polarizer and the organic electroluminescent light emitting element is −50 to 50 nm.

9. The organic electroluminescent display device according to claim 7, further comprising:
a C-plate between the polarizer and the organic electroluminescent light emitting element.

10. An optical laminate film comprising, at least:
a polarizer;
a phase difference layer; and
a circularly polarized light separating layer,
wherein the polarizer, the phase difference layer, and the circularly polarized light separating layer are arranged in this order,
an in-plane retardation Re(550) of the phase difference layer is 120 to 160 nm,
the polarizer and the phase difference layer are arranged such that an angle formed between a transmission axis of the polarizer and a slow axis of the phase difference layer is 45°+10°,
the circularly polarized light separating layer is a cholesteric liquid crystal layer formed by fixing a cholesteric liquid crystalline phase, the circularly polarized light separating layer has an in-plane phase difference, and an angle formed between a slow axis of the phase difference layer and a slow axis of the circularly polarized light separating layer is −30° to 30°.

11. The optical laminate film according to claim 10, wherein the circularly polarized light separating layer is formed of a disk-like liquid crystal compound.

12. The optical laminate film according to claim 10, wherein a selective reflection center wavelength of the circularly polarized light separating layer is in a range of 430 to 480 nm.

13. The optical laminate film according to claim 10, wherein a selective reflection center wavelength of the circularly polarized light separating layer is in a range of 700 to 800 nm.

14. The optical laminate film according to claim 10, wherein the phase difference layer exhibits reciprocal wavelength dispersibility.

15. The optical laminate film according to claim 10, wherein the number of spiral turns of the circularly polarized light separating layer is 1.5 to 6.5.

16. An organic electroluminescent display device comprising:
the optical laminate film according to claim 10; and
an organic electroluminescent light emitting element,
wherein the optical laminate film and the organic electroluminescent light emitting element are arranged so as to sandwich the circularly polarized light separating layer between the phase difference layer and the organic electroluminescent light emitting element.

17. The organic electroluminescent display device according to claim 16, wherein a total of retardations Rth(550) in a thickness direction of members arranged between the polarizer and the organic electroluminescent light emitting element is −50 to 50 nm.

18. The organic electroluminescent display device according to claim 16, further comprising:
a C-plate between the polarizer and the organic electroluminescent light emitting element.

* * * * *